(12) United States Patent
Nishikawa

(10) Patent No.: US 6,213,478 B1
(45) Date of Patent: Apr. 10, 2001

(54) HOLDING MECHANISM FOR A SUSCEPTOR IN A SUBSTRATE PROCESSING REACTOR

(75) Inventor: Katsuhito Nishikawa, San Jose, CA (US)

(73) Assignee: Moore Epitaxial, Inc., Tracy, CA (US)

( * ) Notice: Subject to any disclaimer, the term of this patent is extended or adjusted under 35 U.S.C. 154(b) by 0 days.

(21) Appl. No.: 09/267,227

(22) Filed: Mar. 11, 1999

(51) Int. Cl.[7] .......................... C23C 14/56; C23C 16/00; B23B 31/20
(52) U.S. Cl. ..................... 279/4.08; 118/500; 118/503; 118/730; 279/51; 409/233; 464/162
(58) Field of Search ..................... 118/500, 503, 118/728, 730; 279/4.08, 51; 464/162; 409/233

(56) References Cited

U.S. PATENT DOCUMENTS

| | | | |
|---|---|---|---|
| 3,625,530 | * 12/1971 | Parsons | 279/4.08 |
| 4,682,920 | * 7/1987 | Rodgers | 279/4.08 |
| 4,791,841 | * 12/1988 | Pruvot et al. | 279/4.08 |
| 5,096,213 | * 3/1992 | Terwilliger et al. | 279/51 |
| 5,198,034 | * 3/1993 | DeBoer et al. | 118/500 |
| 5,571,324 | * 11/1996 | Sago et al. | 118/503 |

* cited by examiner

*Primary Examiner*—Steven C. Bishop
(74) *Attorney, Agent, or Firm*—Forrest Gunnison; Gunnison, McKay & Hodgson, LLP

(57) ABSTRACT

A collet assembly coupled to a rotary-linear drive unit allows easily placement of a susceptor shaft within a collet of the collet assembly when the collet assembly is in a first position. After the susceptor shaft is placed into the collet, the collet assembly is retracted to a second position by a spring force acting on a collet draw bar that is coupled to the collet. As the collet assembly is retracted by the spring force, the collet is closed about the susceptor shaft by the interaction between the collet and a collet spindle in which the collet is moveably mounted. As the collet closes, the collet assembly exerts a pressure about a circumferential surface of a susceptor shaft that in turn holds the susceptor shaft firmly in place within the collet, i.e., holds the susceptor shaft stationary within the collet. Consequently, when the susceptor shaft is rotated by the rotary-linear drive unit, there is no wobble associated with the rotary movement of the susceptor shaft. To disengage the collet, the rotary-linear drive unit provides a force that moves the collet upwards which in turn causes the collet to release the pressure on the susceptor shaft. Thus, a linear motion is used to engage and disengage the collet, while a rotary motion is used to turn the susceptor shaft.

20 Claims, 18 Drawing Sheets

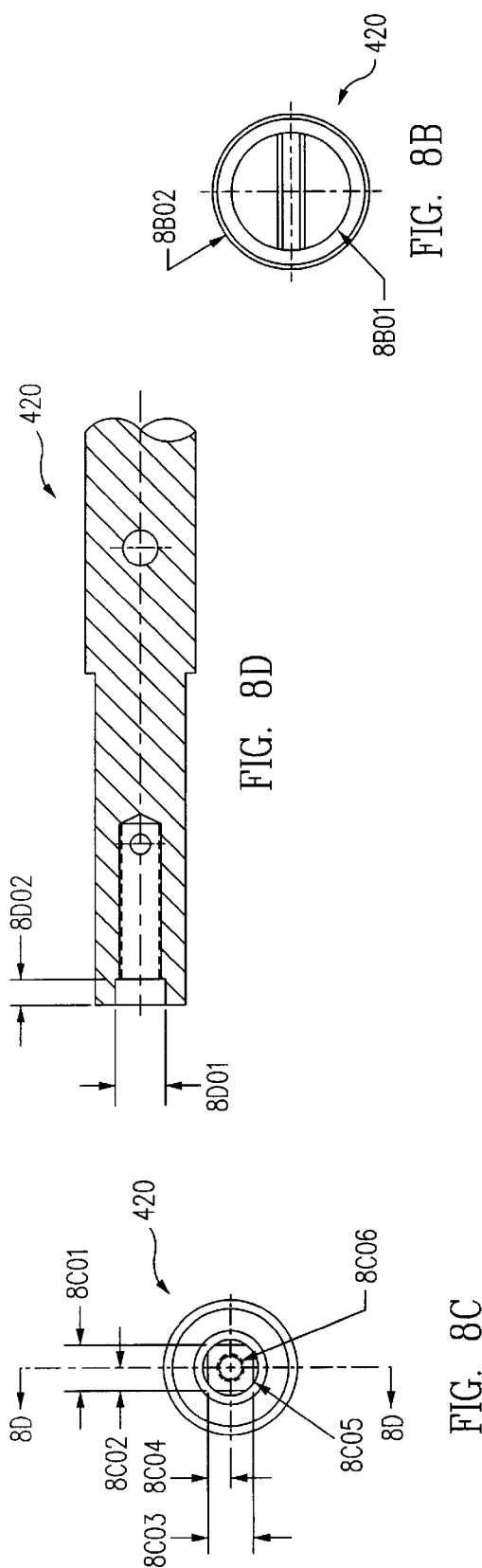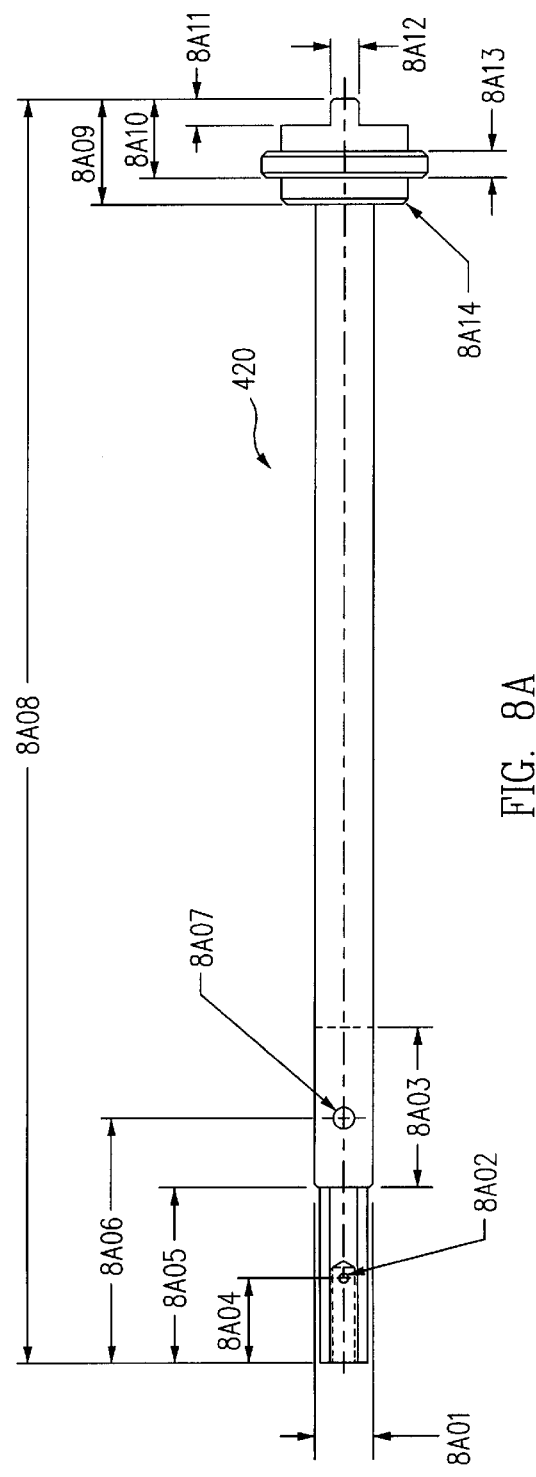
FIG. 8B
FIG. 8D
FIG. 8C
FIG. 8A

HOLDING MECHANISM FOR A SUSCEPTOR IN A SUBSTRATE PROCESSING REACTOR

FIELD OF THE INVENTION

This invention relates generally to reactors for processing semiconductor substrates, and more particularly, to a mechanism for holding and releasing a susceptor shaft in such reactors.

BACKGROUND OF THE INVENTION

A variety of reactors has been used to process semiconductor substrates. Typically, each reactor 100 included a reaction chamber 105 within which a susceptor 107 was mounted. Susceptor 107 supported one of more substrates 190.

To improve process uniformity, typically, susceptor 107 was rotated by a rotation assembly that included pulleys 127, 128, and motor 123. Those of skill in the art will appreciate that reactor 100 includes several other components. However, herein, only the components necessary to understand the limitations of prior art reactor 100 are considered.

For reactor 100, a shaft 110 was part of susceptor 107. To mount susceptor 107 in reaction chamber 105, dome top 109 was removed from base 125. Shaft 110 of susceptor 107 was placed in a slip-fit bore 115 of a spindle 113.

Spindle 113 extended through reaction chamber 105 and was connected to a pulley 128 outside of reaction chamber 105. Pulley 128 was driven by another pulley 127, which in turn was driven by stepper motor 123.

Normally, susceptor 107 assumed two positions, a lower wafer load position and an elevated wafer processing position. In FIG. 1, the dashed lines within reaction chamber 105 show the substrate processing position of susceptor 107 while the solid lines show the substrate load position.

One problem with reactor 100 was the coupling between spindle 113 and shaft 110. To permit shaft 110 to fit inside bore 115, bore 115 had a slightly larger diameter than a diameter of shaft 110. The resulting small clearance between shaft 110 and bore 115 allowed susceptor 107 to move about within bore 115 as susceptor 107 was rotated during processing.

The movement within bore 115 resulted in a wobble of susceptor 107. The wobble was most accentuated at the periphery of susceptor 107 and resulted in poor epitaxial characteristics.

The wobble of susceptor 107 also resulted in wearing of susceptor shaft 110 which in turn increased the clearance and resulted in a more severe wobble. Reactor 100 was stopped for maintenance when the movement of the susceptor associated with the wobble exceeded a predetermined limit.

To improve the quality of the epitaxial deposition and to reduce maintenance, there is a need to effectively eliminate susceptor wobble while keeping the installation and removal of susceptor 107 reasonably easy.

SUMMARY OF THE INVENTION

According to the principles of this invention, a novel collet assembly allows a susceptor shaft to be quickly installed and removed. Moreover, the novel collet assembly eliminates any movement of the susceptor shaft within the collet as the susceptor shaft is rotated. Therefore, the collet assembly eliminates wobble associated with the susceptor shaft moving about within the mechanism holding the susceptor shaft. Consequently, the collet assembly of this invention results in more uniform processing than in the prior art configuration described above.

The collet assembly is coupled to a rotary-linear drive unit. The collet assembly allows easy placement of a susceptor shaft within a collet of the collet assembly when the collet assembly is in a first position.

After the susceptor shaft is placed into the collet, the collet assembly is retracted to a second position by a spring force acting on a collet draw bar that is coupled to the collet. As the collet assembly is retracted by the spring force, the collet is closed about the susceptor shaft by the interaction between the collet and a collet spindle in which the collet is moveably mounted.

As the collet closes, the collet assembly exerts a pressure about a circumferential surface of a susceptor shaft that in turn holds the susceptor shaft firmly in place within the collet, i.e., holds the susceptor shaft stationary within the collet. Consequently, when the susceptor shaft is rotated by the rotary-linear drive unit, there is no wobble associated with movement of the susceptor shaft within the collet.

To disengage the collet, the rotary-linear drive unit provides a force that moves the collet upwards which in turn causes the collet to release the pressure on the susceptor shaft. Thus, a linear motion is used to engage and disengage the collet, while a rotary motion is used to turn the susceptor shaft.

In one embodiment, the collet is connected to a draw bar, which is spring loaded by a clamp spring. During normal operation, the clamp spring provides sufficient force to cause the collet to firmly grasp the susceptor. To release the susceptor shaft, another force, opposite in direction to the force of the clamp spring, is applied to the collet by a linear motion drive unit.

In one embodiment, the linear motion drive unit is a pneumatic unit that includes a piston assembly mounted within a cylinder. The linear motion drive unit is coupled to the collet draw bar by a motion coupler unit. The motion coupler unit allows the linear motion drive unit to transfer linear motion to the collet draw bar without requiring a corresponding linear movement of a rotary motion drive unit. Similarly, the rotary motion drive unit provides rotary motion to the collet draw bar independent of the state of the linear motion drive unit. In one embodiment, the motion coupler unit includes a sleeve having a top surface and a bottom surface bounding a wall of the sleeve with a first set of slots in the wall extending from the top surface, and a second set slots extending from the bottom surface. A first shaft is movably mounted in the first set of slots. A second shaft is movably mounted in the second set of slots.

When the sleeve is moved up by a linear motive force, the first set of slots engage the first shaft and move the first shaft up, while the second set of slots are orientated so that the vertical position of the second shaft remains in the original position. When the second shaft is rotated, the sleeve transfers the rotary motion to the first shaft independent of the position of the first shaft relative to the first set of slots. Thus, a rotary motion drive unit drives the second shaft, while a linear motion drive unit drives the sleeve in the motion coupler unit of this invention.

Thus, with the collet and the drive units of this invention, a susceptor shaft in a substrate processing reactor is grasped, engaged, and rotated by:

placing a susceptor shaft in a collet;

moving the collet in a first direction using a linear drive unit to release the susceptor shaft; and moving the collet in a second direction opposite to the first direction to grasp the susceptor shaft wherein the first and second directions are about a longitudinal axis of the collet; and rotating the collet using a rotary drive unit independent of a location of the collet along the longitudinal axis of the collet.

The combination of the collet assembly and the rotary-linear drive unit does not hinder the capability normally needed for a susceptor in a substrate processing reactor, and does eliminate a source of wobble. Therefore, reactors that utilize this invention have better process uniformity than the prior art reactors that had susceptor wobble associated with the mechanism used to grasp the susceptor shaft.

BRIEF DESCRIPTION OF THE DRAWINGS

FIG. 8A is a side view of one embodiment of a collet draw bar of this invention.

FIG. 8B is a top view of the collet draw bar of FIG. 8A.

FIG. 8C is a bottom view of the collet draw bar of FIG. 8A.

FIG. 8D is a partial cutaway cross section view as indicated in FIG. 8C of the collet draw bar of FIG. 8A.

In the following description, elements with the same reference numeral are the same element. Also, the first digit of each element's reference numeral indicates the Figure number in which that element first appeared.

DETAILED DESCRIPTION OF THE INVENTION

Figure 1:
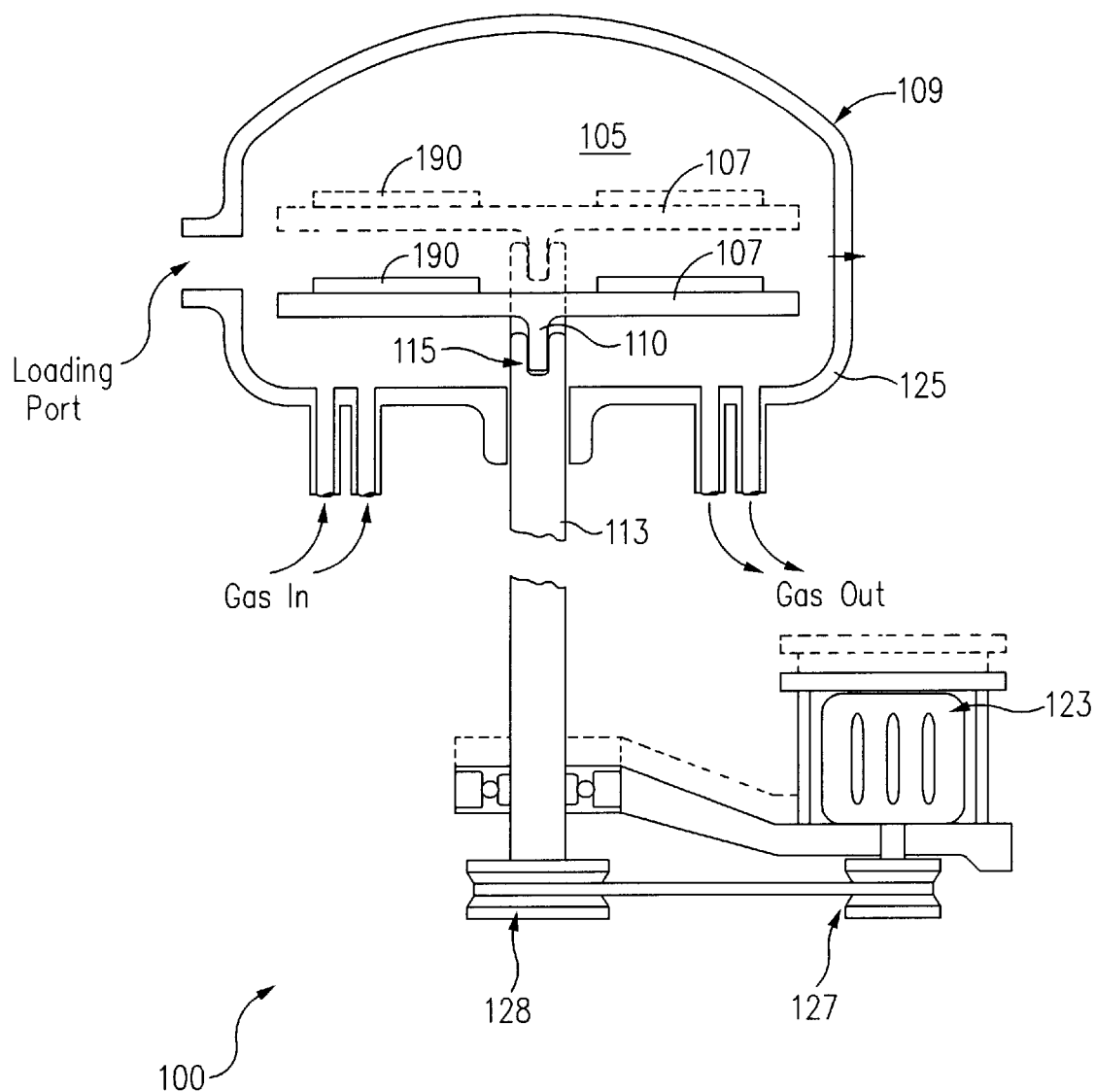
FIG. 1 is a diagram of a prior art reactor with a susceptor holding mechanism that resulted in susceptor wobble.

In accordance with the present invention, a collet assembly 200 allows easily placement of a susceptor shaft 210 (FIG. 2A.) within a collet 215 of collet assembly 200 when collet assembly 200 is in a first position. After susceptor shaft 210 is placed into collet 215, collet assembly 200 is retracted to a second position (FIG. 2B.) by a collet draw bar 220 that is coupled to collet 215.

As collet assembly 200 is retracted, collet 200 is closed about susceptor shaft 210 by the interaction between collet 215 and collet spindle 205 in which collet 215 is moveably mounted. Thus, as collet assembly 200 is retracted to a second position that is removed from the first position, (Compare FIGS. 2A and 2B.) collet assembly 200 exerts a pressure about a circumferential surface 210A of susceptor shaft 210 that in turn holds susceptor shaft 210 in place, i.e., holds susceptor shaft 210 stationary within collet assembly 200. Consequently, when susceptor shaft 210 is rotated, there is no wobble associated with movement of susceptor shaft 210 within collet assembly 200. Thus, a linear motion is used to engage and disengage collet 215, while a rotary motion is used to turn susceptor shaft 210.

Collet assembly 200 provides several advantages over the prior art configuration. Collet assembly 200 allows easy placement, and removal of susceptor 207 in a reaction chamber. In addition, collet assembly 200 eliminates a source of wobble, which in turn results in more uniform processing throughout the lifetime of a reactor. Moreover, since the wobble has been eliminated, the wear on susceptor shaft 210 is reduced which in turn reduces maintenance required to correct susceptor wobble.

Figure 2A:
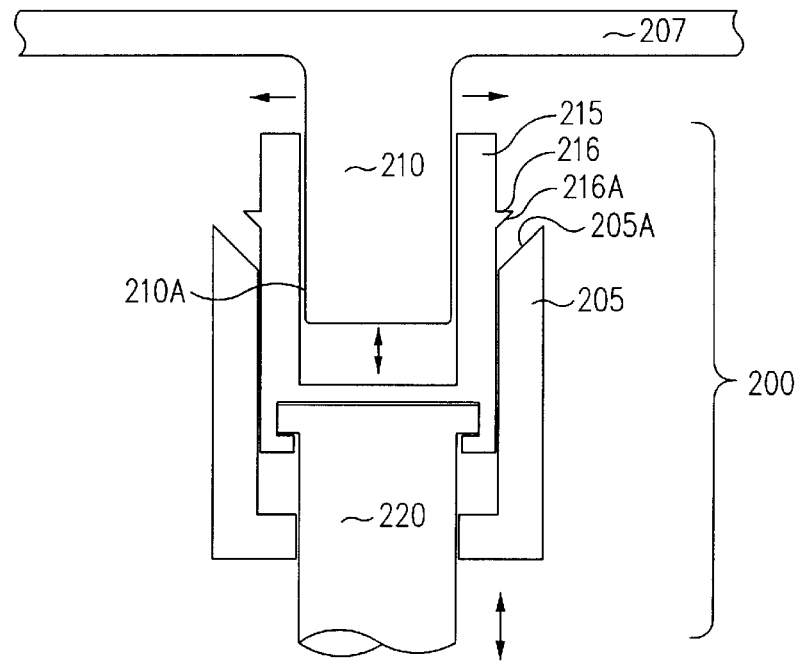
FIG. 2A is a diagram of one embodiment of a collet in a released position in accordance with the present invention.
Figure 2B:
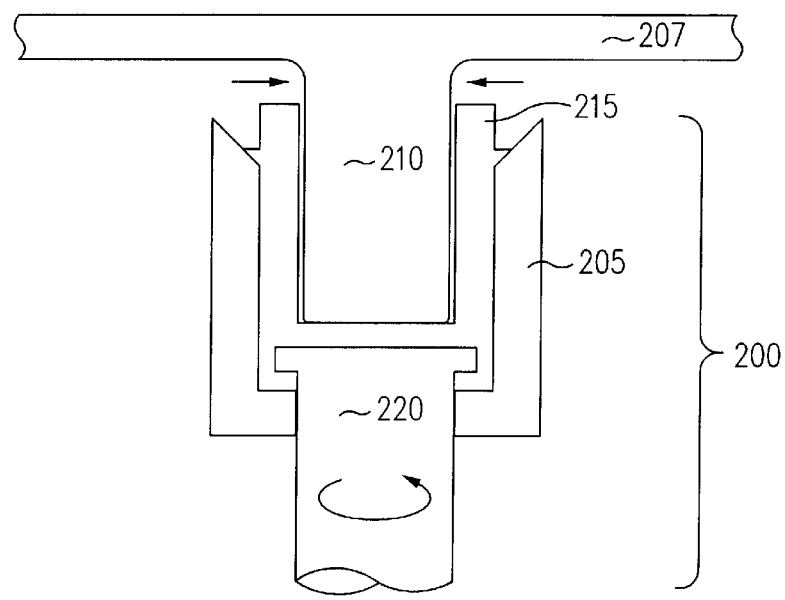
FIG. 2B is a diagram of the collet of FIG. 2A in an engaged position in accordance with the present invention.

As shown in FIGS. 2A and 2B, collet spindle 205 has an edge surface 205A that mates with a complementary edge surface 216A of a lip 216 about an outer circumferential surface of collet 215. The two mating edge surfaces are designed so that when a linear force in a second direction is exerted on collet 215, collet 215 moves linearly in the second direction, and the two mating edge surfaces cause the cylindrical wall of collet 215 to move radially inward and grasp susceptor shaft 210.

Conversely, when a linear force in a first direction is applied to collet 215, collet 215 is moved in the first direction. As collet 215 moves upwards, the mating edge surfaces no longer interact, and the characteristics of collet 215 cause the cylindrical walls to move radially apart. This removes the pressure on susceptor shaft 210 so that susceptor 207 can be removed. Hence, FIG. 2A is applicable both when susceptor 207 is being inserted and when susceptor 207 is being removed.

In view of the above description, collet assembly 200 can be implemented in a variety of ways by one of skill in the art. An important aspect is that the collet assembly grasps the susceptor shaft to prevent movement of the susceptor shaft within the collet assembly as the susceptor shaft is rotated. Therefore, the embodiments described herein are only illustrative of the principles of the invention, and are not intended to limit the invention to the specific configurations described. In view of this disclosure, those of skill in the art can implement the functionality of this invention in a variety of ways.

Figure 3:
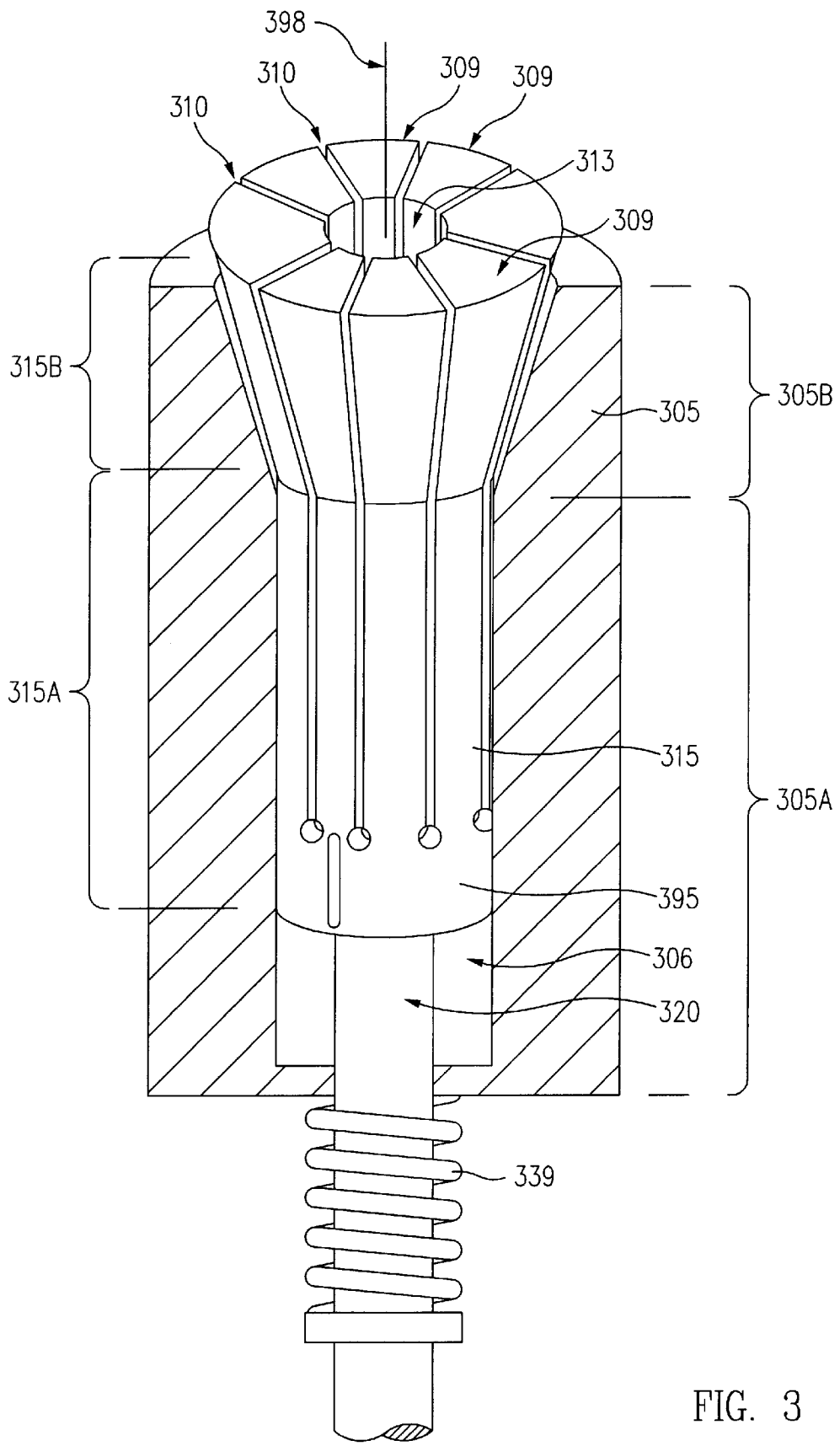
FIG. 3 is a diagram of another embodiment of a collet in accordance with the present invention.

In an embodiment described more completely below, collet 215 is made of three pieces. In yet another embodiment that is illustrated in FIG. 3, a collet 315 includes a cylindrical portion 315A that extends vertically from a conical portion 315B. Collet 315 is divided into individual finger elements 309 by slots 310 radiating from a central axis 398.

Each finger element 309 extends vertically from a unitary root section 395 of collet 315. An inner surface of each finger element 309 defines a portion of a cylindrical bore 313. In the first position, as shown in FIG. 3, cylindrical bore 313 is larger than a diameter of the susceptor shaft, which facilitates placement and removal of the susceptor shaft into, and from bore 313, respectively. In addition, in this position, cylindrical bore 313 is only substantially cylindrical because the conical portion of each finger springs outward away from central axis 398.

Collet 315 is mounted within a bore 306 of collet spindle 305 and is connected to a collet draw bar 320, which is spring loaded by clamp spring 339. Bore 306 has a cylindrical portion and a conical portion in correspondence with cylindrical portion 315A and cone portion 315B of collet 315. Bore 306 is centered about central axis 398.

In this embodiment, when collet draw bar 320 is pulled downward by clamp spring 339, collet 315 is also pulled downward. As collet 315 moves downward, conical portion 315B is pressed against conical portion 305B of collet spindle 305. This moves finger elements 309 towards central axis 398, i.e., towards the center of bore 313. On the other hand, when collet draw bar 320 is pushed upwards against the force of clamp spring 339, radial fingers 309 are free from the compression force. Consequently, finger elements 309 move away from the center of bore 313 and expand to assume a larger diameter.

Thus, while a different physical configuration is shown in FIG. 3 from that in FIGS. 2A and 2B, the principles of operation are the same. A linear motion is used to engage and disengage a collet. A rotary motion is used to turn the collet, and in turn a susceptor grasped by the collet. Since the collet holds the susceptor firmly, there is no movement with the collet as the susceptor is rotated.

Figure 4:
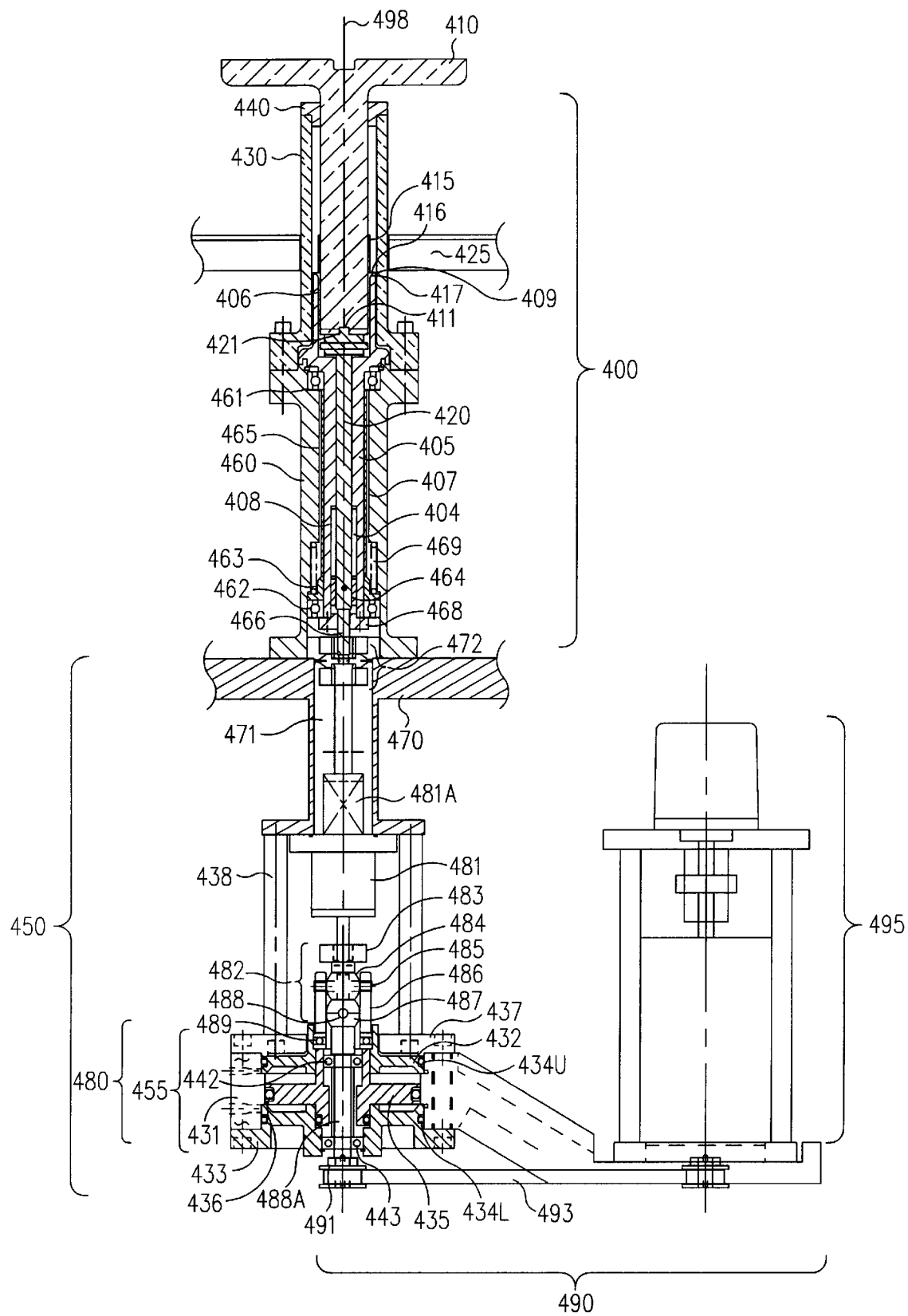
FIG. 4 is a cut-away view of one embodiment of a collet assembly coupled to a rotary-linear drive unit according to the principles of this invention.

FIG. 4 is a more detailed diagram of one embodiment of a collet assembly 400 coupled to a rotary-linear drive unit 450 according to the principles of this invention. Rotary-linear drive unit 450 generates a rotary motion that is used to rotate collet assembly 400, and a linear motion that is used to disengage and engage collet 415.

In this embodiment, collet 415 is formed from three separate collet elements (See FIG. 6B.), a plurality of collet elements, which in the second position referred to above, form a substantially right circular cylinder. An outer diameter of this substantially right circular cylinder 415 is defined by a first bore 406 of collet spindle 405.

Collet 415 is coupled to a collet draw bar 420 that in turn extends through a second bore 407 of collet spindle 405. Clamp spring 404 that is mounted within a third bore 408 of collet spindle 405 maintains sufficient force to hold collet 415 in the closed position.

Specifically, clamp spring 404 exerts a force on collet draw bar 420 that in turn transfers the force to collet 415. The force on collet 415 causes a tapered edge surface 417 of collet lip 416 to engage a complementary tapered edge surface 409 of collet spindle 405. As edge surface 417 moves down edge surface 409, the vertical force supplied by clamp spring 404 is redirected so that collet 415 is compressed against an outer circumferential surface of susceptor pedestal shaft 410.

When an upward force is applied to collet draw bar 420 by rotary-linear drive unit 450, clamp spring 404 is compressed and collet 415 moves up within bore 406. As collet 415 moves upward, surfaces 417 and 409 disengage. When collet 415 moves far enough that surfaces 417 and 409 are no longer in contact, the outer diameter of collet 415 can increase because the three pieces are no longer being pushed together by the interaction of surfaces 417 and 409. This releases the pressure on susceptor shaft 410.

Susceptor shaft 410 is representative of one type of a susceptor shaft that can be used with this invention. In this embodiment, susceptor shaft 410 is a susceptor pedestal shaft. A two-layer susceptor is mounted on top of the susceptor pedestal shaft. See for example, U.S. Pat. No. 5,580,388, entitled "Muli-layer Susceptor For Rapid Thermal Process Reactors," of Gary M. Moore issued on Dec. 3, 1996, which is incorporated herein by reference in its entirety.

Susceptor shaft 410 has a key way 411 in a bottom edge surface that mates with a key 421 of collet draw bar 420. Key way 411 and key 421 are representative of one way to couple susceptor shaft 410 to a source of rotational motion so that the susceptor can be rotated. This coupling mechanism is illustrative only. Any coupling mechanism can be used that permits transfer of rotational motion to the susceptor, and that permits the operation of collet assembly 400, as described herein.

A sleeve 430 surrounds susceptor shaft 410, collet 415, and part of collet spindle 405. Sleeve 430 extends through a bottom 425 of the reaction chamber and is attached to a spindle housing 460 outside the reaction chamber. A cylindrical sleeve cap 440 is placed in a top of sleeve 430. Susceptor shaft 410 extends through a center opening in cylindrical sleeve cap 440.

As shown in FIG. 4, spindle housing 460 rests on pedestal lift plate 470. While it is not shown in FIG. 4, a bellows is mounted between the bottom of reaction chamber 425 and a top surface of pedestal lift plate 470. The bellows surrounds the equipment illustrated and prevents any processing gases passed through the equipment from reaching the environment. The bellows is similar to those used on prior art reactors and so is not considered further. In addition, a lift assembly is used to move pedestal lift sleeve and consequently the susceptor between the load and processing positions. This equipment is not shown to avoid detracting from the features of this invention, and is similar to the equipment used in the prior art reactors for this purpose.

Collet spindle 405 is rotatably mounted within spindle housing 460. Rotational motion from rotary-linear drive unit 450 is transferred to collet draw bar 420 by a coupler shaft 466 with a first end that is screwed into collet draw bar 420. A second end of coupler shaft 466 is connected to a bellows coupling unit 472 mounted with a bore 471 of pedestal lift plate 470.

A shaft of a rotary-linear seal unit 481 is also connected to bellows coupling unit 472. Rotary-linear seal unit 481 contacts a bottom surface of pedestal lift plate 470, and an 0-ring forms a seal between the two parts. Rotary-linear seal unit 481 also is connected to a shaft of a motion coupler unit 482 that transfers both rotary and linear motion to unit 481. Thus, unit 481 transfers rotary and linear motion from motion coupler unit 482 to bellows coupling unit 472 that in turn transfers the motions to coupler shaft 466, and consequently to draw bar 420.

Motion coupler unit 482 is connected to both linear motion drive unit 480 and rotary motion drive unit 490. As explained more completely below, linear motion drive unit 480 provides a linear motive force to move collet draw bar 420 in a first direction against the force, which is supplied by clamp spring 404, in a second direction that is opposite to the first direction. Rotary motion drive unit 490 provides a rotary motion to motion coupler unit 482 that is used to turn the susceptor during processing, and during loading and unloading of substrates.

Figures 5A, 5B:
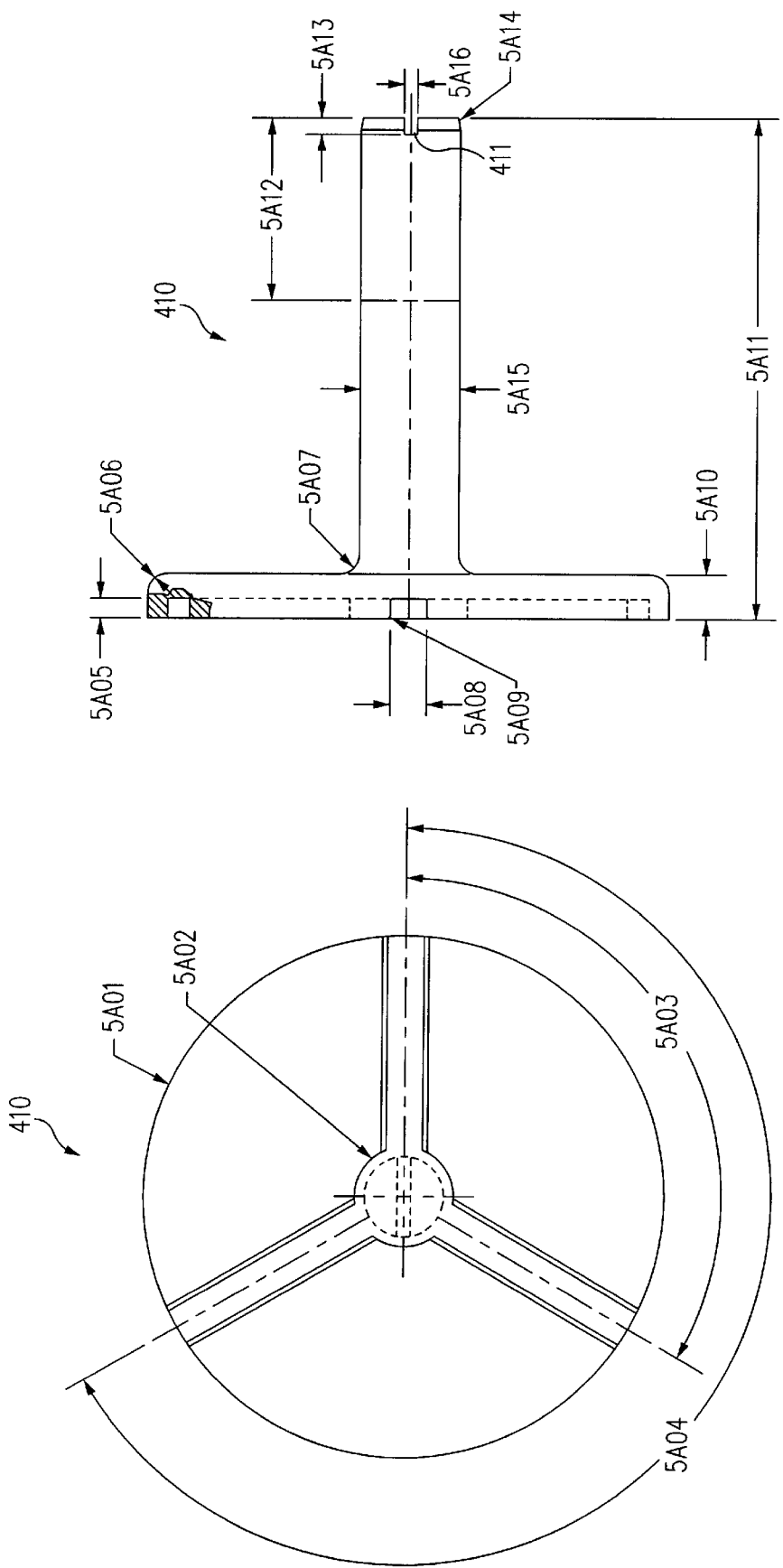
FIG. 5A is top view of one embodiment of a susceptor shaft suitable for use with the collect assembly of FIG. 4.
FIG. 5B is a side view of the susceptor shaft of FIG. 5A.

FIGS. 5A and 5B are a more detailed diagram of one embodiment of susceptor shaft 410. In this embodiment, susceptor shaft 410 is made of opaque quartz with a fire polished finish. One source of opaque quartz suitable for use in this invention is available from Nippon Silica Glass, 1952 Route 22 East, Bound Brook, N.J. 08805-1520 with product number NSG-OP-1.

TABLE 1 gives one embodiment of the dimensions of susceptor shaft 410. In this embodiment, diameter 5A15 of susceptor shaft 410 is 1.124 inches. In the portion of susceptor shaft 410 indicated by reference numeral 5A12 (FIG. 5B.), the diameter is precisely controlled to assure that susceptor shaft 410 is grasped by collet 415. In this region, the variation in diameter 5A12 is limited to +0.000 to –0.001 inches. However, the tolerances in a particular application are dependent upon several factors and so these tolerances are illustrative only and are not an essential feature of the invention.

TABLE 1

REPRESENTATIVE DIMENSIONS FOR
SUSCEPTOR PEDESTAL SHAFT 410

| Reference Number | Dimension | Units |
|---|---|---|
| 5A01 | 6.00 (Diameter) | Inches |
| 5A02 | 1.38 (Diameter) | Inches |
| 5A03 | 120 | Degrees |
| 5A04 | 240 | Degrees |
| 5A05 | 0.250 | Inches |
| 5A06 | 0.25 radius | Inches |
| 5A07 | 0.25 radius | Inches |
| 5A08 | 0.500 | Inches |
| 5A09 | 0.06 × 45° chamfer | Inches |
| 5A10 | 0.63 | Inches |
| 5A11 | 6.82 | Inches |
| 5A12 | 2.50 | Inches |
| 5A13 | 0.188 | Inches |
| 5A14 | 0.13 × 15° chamfer | Inches |
| 5A15 | 1.124 | Inches |
| 5A16 | 0.188 | Inches |

Figure 6A:
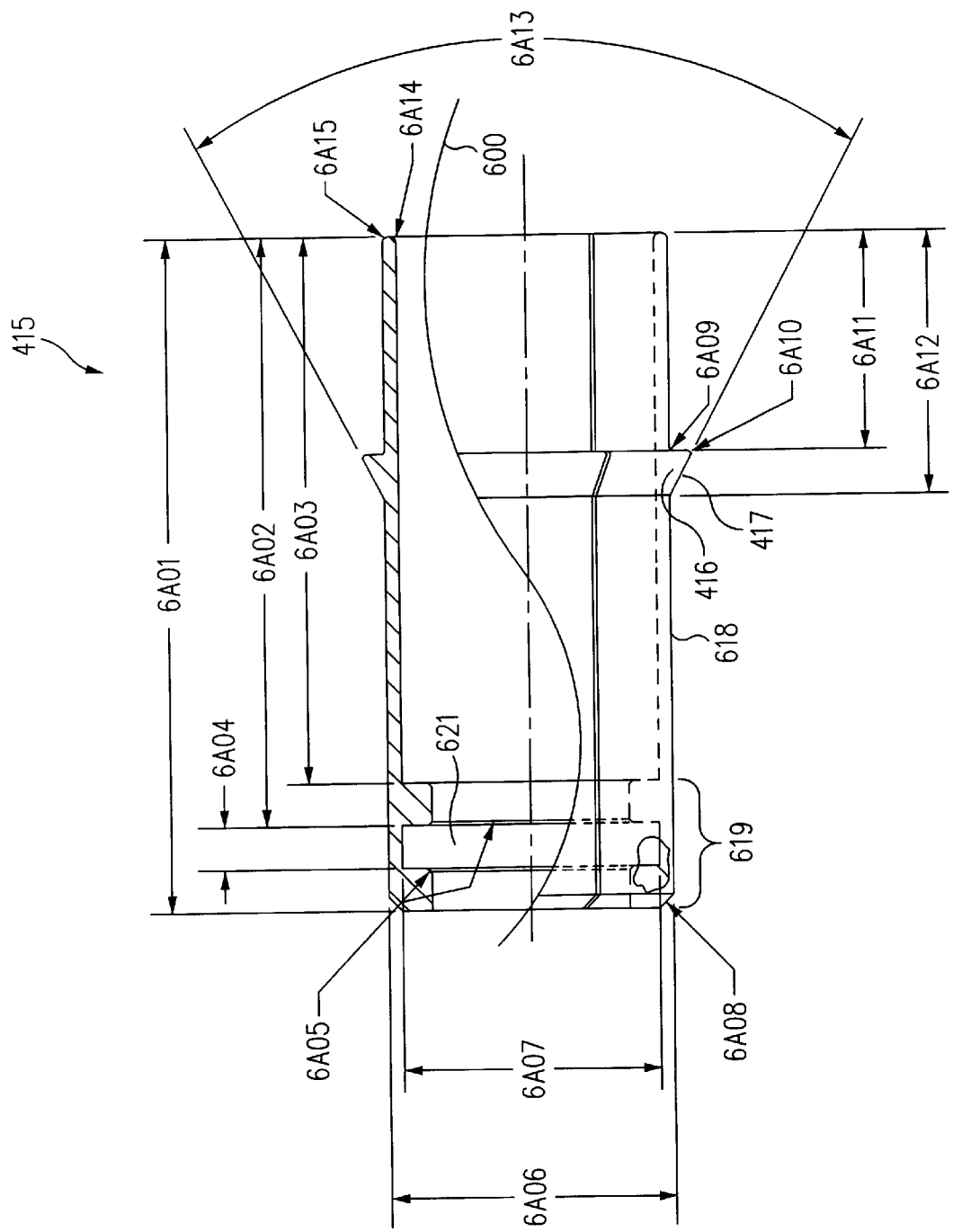
FIG. 6A is a side view of one embodiment of the collet of this invention.
Figure 6B:
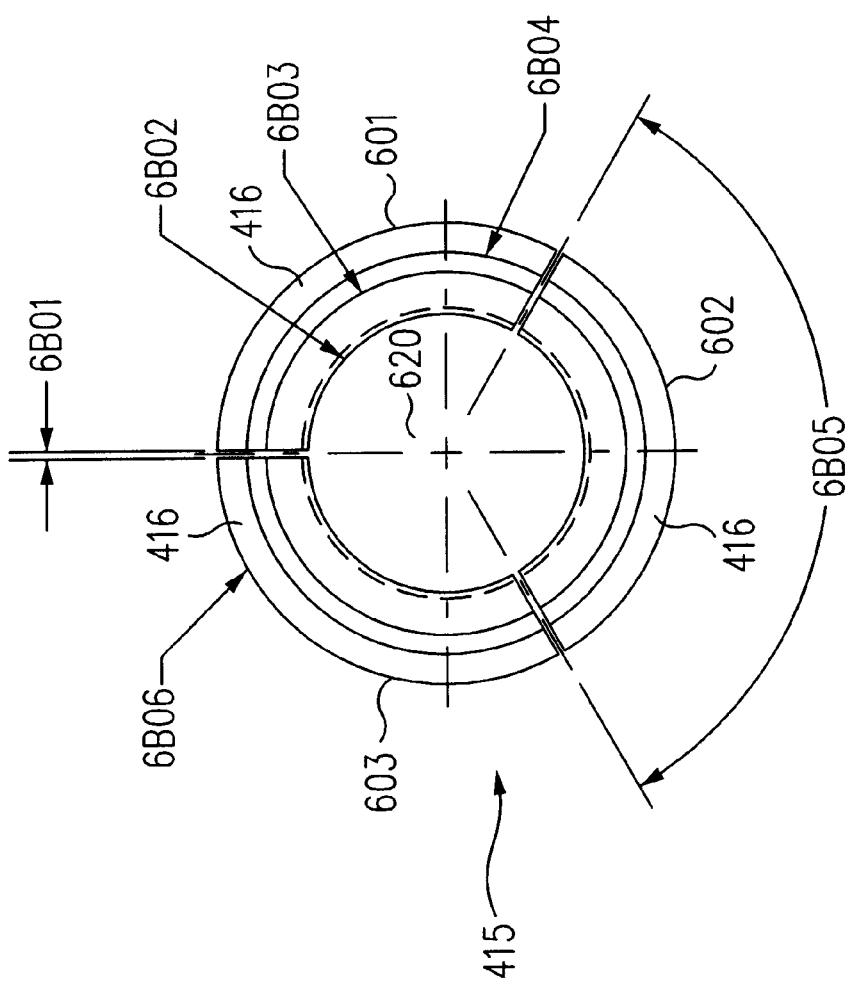
FIG. 6B is a top view of the collet of FIG. 6A.

FIGS. 6A and 6B are side and top views respectively of collet 415. In FIG. 6A, a cut is made along line 600 to more clearly show the interior features of collet 415 without requiring another figure. Collet 415 includes three pieces 601, 602, 603 (FIG. 6B.) that are each separated from the other by a predefined distance 6B01. Each piece has a lip 416 10 about outer circumferential surface 618 (FIG. 6A).

Lip 416 has a tapered edge surface 417. A bottom 619 of collet 415 forms a hole 620 (FIG. 6B). A groove 621 with a diameter greater than the diameter of hole 620 is also formed by bottom 619. FIG. 4 illustrates how a portion of collet draw bar 420 fits in groove 621.

TABLE 2 presents one embodiment of dimensions for collet 415 that are used with a susceptor shaft 410 having the dimension given in TABLE 1. In this embodiment, collet 415 is stainless steel 316L with an electropolish finish.

TABLE 2

REPRESENTATIVE DIMENSIONS FOR COLLET 415

| Reference Number | Dimension | Units |
|---|---|---|
| 6A01 | 2.940 | Inches |
| 6A02 | 2.586 | Inches |
| 6A03 | 2.409 | Inches |
| 6A04 | 0.177 | Inches |
| 6A05 | 0.020 × 45° chamfer | Inches |
| 6A06 | 1.246 diameter | Inches |
| 6A07 | 1.115 diameter | Inches |
| 6A08 | 0.060 × 45° chamfer | Inches |
| 6A09 | 0.030 radius | Inches |
| 6A10 | 0.020 radius | Inches |
| 6A11 | 0.940 | Inches |
| 6A12 | 1.134 | Inches |
| 6A13 | 60 | Degrees |
| 6A14 | 0.030 radius | Inches |
| 6A15 | 0.020 radius | Inches |
| 6B01 | 0.020 | Inches |
| 6B02 | 0.861 diameter | Inches |
| 6B03 | 1.126 diameter | Inches |
| 6B04 | 1.250 diameter | Inches |
| 6B05 | 120 | Degrees |
| 6B06 | 1.441 diameter | Inches |

Figure 7B:
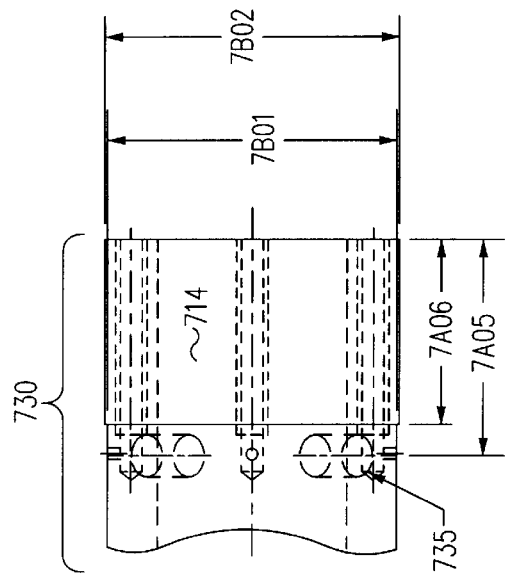
FIG. 7B is an enlarged view of a bottom portion of the collet spindle of FIG. 7A.
Figure 7C:
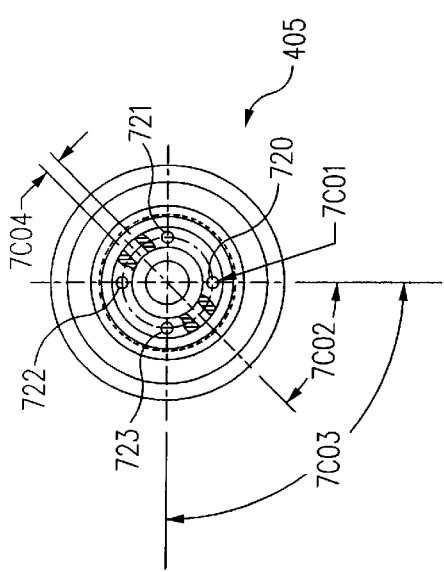
FIG. 7C is a bottom view of the collet spindle of FIG. 7A.
Figure 7A:
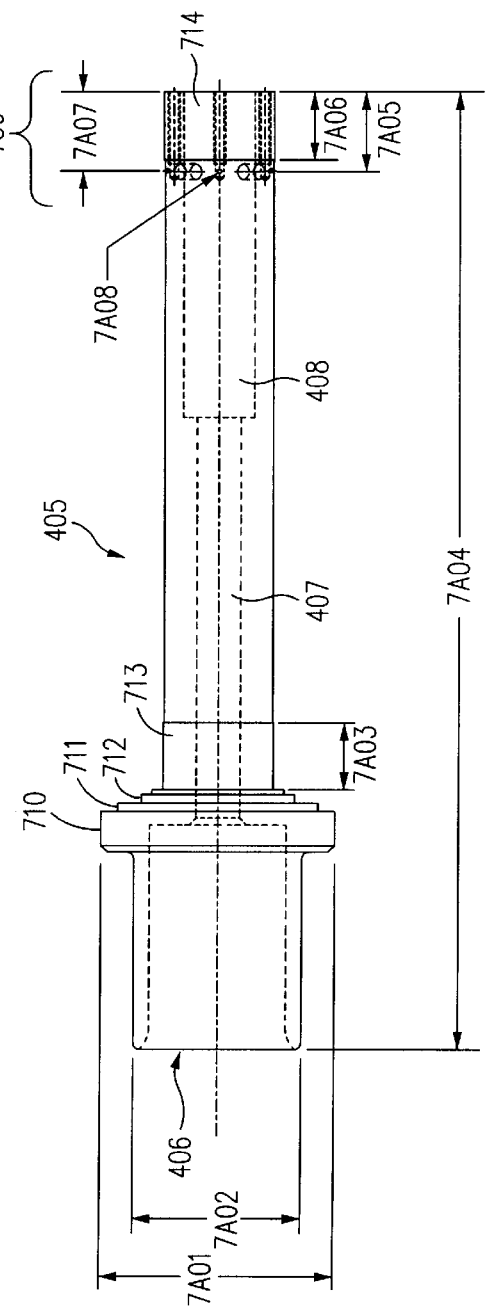
FIG. 7A is a side view of one embodiment of a collet spindle of this invention.
Figure 7E:
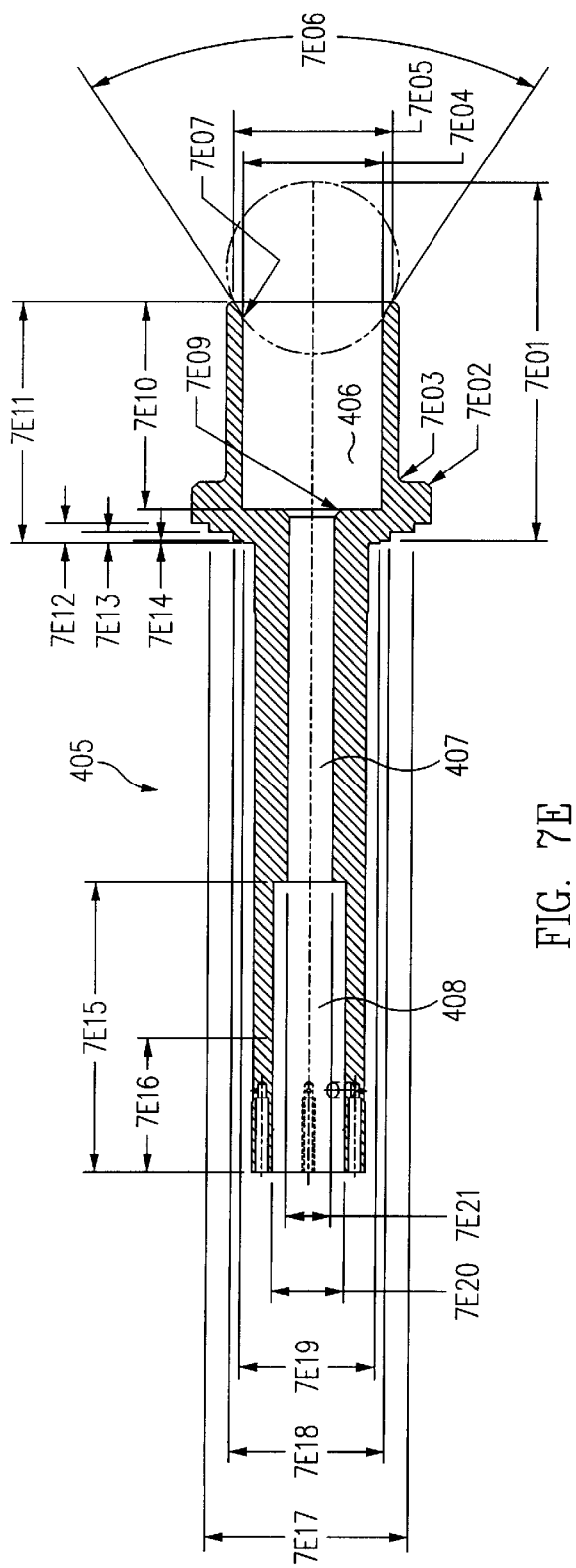
FIG. 7E is a cross-sectional cut away view of the collet spindle of FIG. 7A.
Figure 7D:
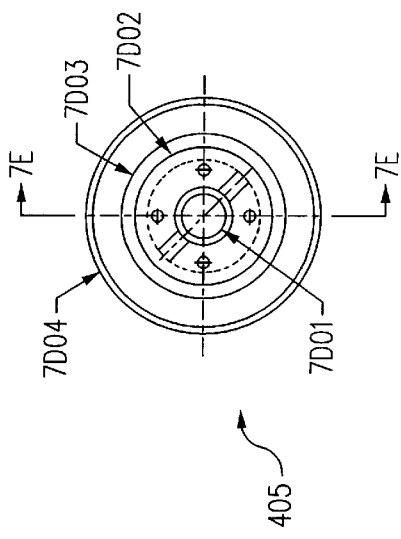
FIG. 7D is a top view of the collet spindle of FIG. 7A.

FIGS. 7A to 7E are various views of one embodiment of collet spindle 405. Specifically, FIG. 7A is a side view; FIG. 7B is an enlarged view of a bottom portion 730 of collet spindle 405; FIG. 7C is a bottom view; FIG. 7D is a top view; and FIG. 7E is a cross-sectional cut away view. In one embodiment, collet spindle 405 is made from a rod bar of stainless steel, 17-7PH RC38-44 with a passivated finish. As described above, collet spindle 405 has a first bore 406 with a diameter approximately equal to an outside diameter of collet 415. A second bore 407 of collet spindle 405 has a diameter that is approximately equal to a diameter of collet draw bar 420. A third bore 408 of collet spindle 405 is sized to house both collet draw bar 420 and clamp spring 404. Bores 406, 407, and 408 are centered about central longitudinal axis 498 of collet assembly 400.

The three bores 406, 407, and 408 of collet spindle 405 are illustrated in FIGS. 7A and 7E. FIGS. 7A, 7B, and 7C illustrate threaded holes 720 to 723 that are used in the attachment of a guide draw bar 468 to collet spindle 405. Thru holes 735 are positioned to allow insertion of a pin through draw bar lock sleeve 469 (See FIGS. 4 and 9A to 9D.) and through hole 8A07 (FIG. 8A.) of draw bar 420 to thereby couple draw bar lock sleeve 469 to draw bar 420. As shown in FIG. 4, clamp spring 404 contact draw bar lock sleeve 469 and so this assembly allows clamp spring 404 to exert a force on draw bar 420 that turn causes collet 415 to grasp shaft 410, as described above.

The exterior shape of collet spindle 405 about the transition from bore 406 to bore 407 is determined by the features desired. The series of diminishing counter bores illustrated in FIG. 7E is used to rotatably support collet spindle 405 on a top surface of spindle housing 460. In another embodiment, the exterior about the transition is a single rim that has a circular grove in the bottom edge surface that is designed to mate with a circular ring of spindle housing 460 to form a labyrinth seal. (See FIG. 4.) The labyrinth seal prevents particles from reaching the interior volumes of spindle housing 460. Collet spindle 405 also has two bearing surfaces 713 and 714.

TABLE 3 presents one embodiment of dimensions of collet spindle 405 that is used with a collet 415 having the dimensions given in TABLE 2.

TABLE 3

REPRESENTATIVE DIMENSIONS FOR COLLET SPINDLE 405

| Reference Number | Dimension | Units |
|---|---|---|
| 7A01 | 2.125 diameter | Inches |
| 7A02 | 1.500 diameter | Inches |
| 7A03 | 0.60 | Inches |
| 7A04 | 8.462 | Inches |
| 7A05 | 0.70 | Inches |
| 7A06 | 0.60 | Inches |
| 7A07 | 0.69 | Inches |
| 7A08 | 0.06 diameter thru one wall | Inches |
| 7B01 | 0.96 diameter | Inches |
| 7B02 | 0.9835 diameter | Inches |
| 7C01 | 4–40 UNC-2B, 0.50 Min on a 0.804 diameter B.C. | |
| 7C02 | 45 | Degrees |
| 7C03 | 90 | Degrees |
| 7C04 | 0.14 diameter | Inches |
| 7D01 | 0.390 diameter | Inches |
| 7D02 | 1.250 diameter | Inches |
| 7D03 | 1.500 diameter | Inches |
| 7D04 | 2.125 diameter | Inches |
| 7E01 | 3.412 | Inches |
| 7E02 | 0.06 × 45° chamfer | Inches |
| 7E03 | 0.06 radius | Inches |
| 7E04 | 1.250 diameter | Inches |
| 7E05 | 1.438 diameter | Inches |
| 7E06 | 60 | Degrees |
| 7E07 | 0.25 radius blend | Inches |
| 7E09 | 0.06 × 45° chamfer | Inches |
| 7E10 | 2.000 | Inches |
| 7E11 | 2.314 | Inches |
| 7E12 | 0.187 | Inches |
| 7E13 | 0.108 | Inches |
| 7E14 | 0.200 | Inches |
| 7E15 | 2.812 | Inches |
| 7E16 | 1.250 | Inches |
| 7E17 | 1.810 diameter | Inches |
| 7E18 | 1.400 diameter | Inches |
| 7E19 | 1.188 diameter | Inches |
| 7E20 | 0.625 diameter | Inches |
| 7E21 | 0.390 diameter | Inches |

FIG. 8A is a side view of collet draw bar 420. FIG. 8B is a top view of collet draw bar 420 while FIG. 8C is a bottom view. FIG. 8D is a partial cutaway cross section as indicated in FIG. 8C. In this embodiment, collet draw bar 420 is 316L stainless steel, and has an electropolish finish.

TABLE 4 presents one embodiment of dimensions for collet draw bar 420 that are used with a collet spindle 405 having the dimensions given in TABLE 3.

TABLE 4

REPRESENTATIVE DIMENSIONS FOR COLLET DRAW BAR 420

| Reference Number | Dimension | Units |
|---|---|---|
| 8A01 | 0.375 diameter | Inches |
| 8A02 | 0.06 diameter thru one wall | Inches |
| 8A03 | 1.00 | Inches |
| 8A04 | 0.56 | Inches |
| 8A05 | 1.15 | Inches |
| 8A06 | 1.590 | Inches |
| 8A07 | 0.126 diameter thru | Inches |
| 8A08 | 8.178 | Inches |
| 8A09 | 0.673 | Inches |
| 8A10 | 0.506 | Inches |
| 8A11 | 0.172 | Inches |
| 8A12 | 0.187 | Inches |
| 8A13 | 0.167 | Inches |
| 8A14 | 0.03 × 45° chamfer | Inches |
| 8B01 | 0.841 diameter | Inches |
| 8B02 | 1.105 diameter | Inches |
| 8C01 | 0.312 | Inches |
| 8C02 | 0.156 | Inches |
| 8C03 | 0.312 | Inches |
| 8C04 | 0.156 | Inches |
| 8C05 | 0.375 diameter | Inches |
| 8C06 | 0.172 diameter × 0.090 Deep C'Bore 8–32 Tap, 0.63 Min. deep | Inches |
| 8D01 | 0.172 diameter | Inches |
| 8D02 | 0.090 | Inches |

Figure 9C:
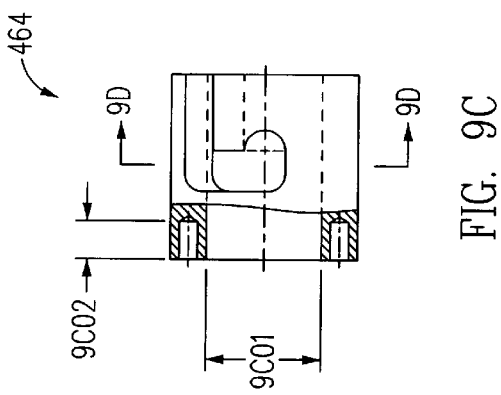
FIGS. 9B and 9C are a left-hand side view and a right hand side view, respectively of the draw bar lock sleeve of FIG. 9A.
Figure 9D:
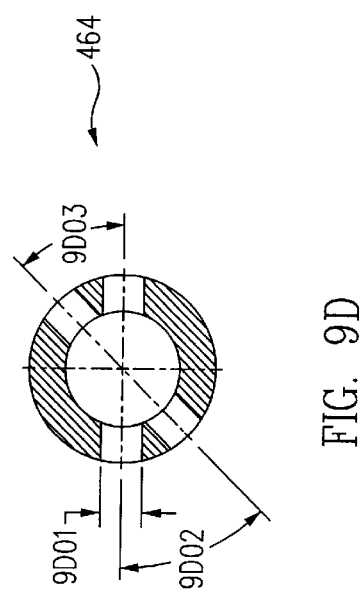
FIG. 9D is a cut-away view of the draw bar lock sleeve along the cut line illustrated in FIG. 9C.
Figure 9A:
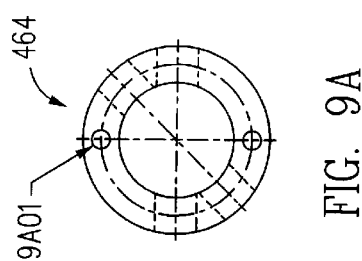
FIG. 9A is a top view of one embodiment of a draw bar lock sleeve of this invention.
Figure 9B:
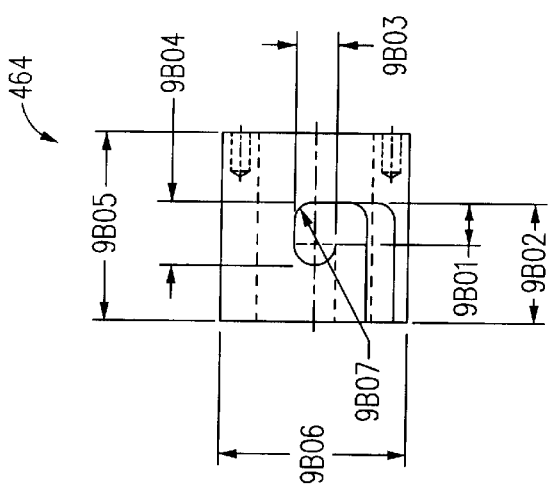

FIG. 9A is a top view of one embodiment of draw bar lock sleeve 464 (FIG. 4). FIGS. 9B and 9C are a left-hand side view and a right hand side view, respectively of draw bar lock sleeve 464. FIG. 9D is a cut-away view of draw bar lock sleeve 464 along the cut line illustrated in FIG. 9C. In this embodiment, collet draw bar lock sleeve 464 is 316L stainless steel, and has an electropolish finish.

TABLE 5 presents one embodiment of dimensions for collet draw bar lock sleeve 464 that are used with a collet spindle 405 having the dimensions given in TABLE 3.

TABLE 5

REPRESENTATIVE DIMENSIONS FOR COLLET DRAW BAR LOCK SLEEVE 464

| Reference Number | Dimension | Units |
|---|---|---|
| 9A01 | 0.067 diameter on a 0.500 diameter B.C. | Inches |
| 9B01 | 0.140 | Inches |
| 9B02 | 0.390 | Inches |
| 9B03 | 0.140 full radius | Inches |
| 9B04 | 0.210 | Inches |
| 9B05 | 0.63 | Inches |
| 9B06 | 0.625 diameter | Inches |
| 9B07 | 0.07 radius | Inches |
| 9C01 | 0.376 diameter thru | Inches |
| 9C02 | 0.13 | Inches |
| 9D01 | 0.140 | Inches |
| 9D02 | 45 | Degrees |
| 9D03 | 45 | Degrees |

Figure 10A:
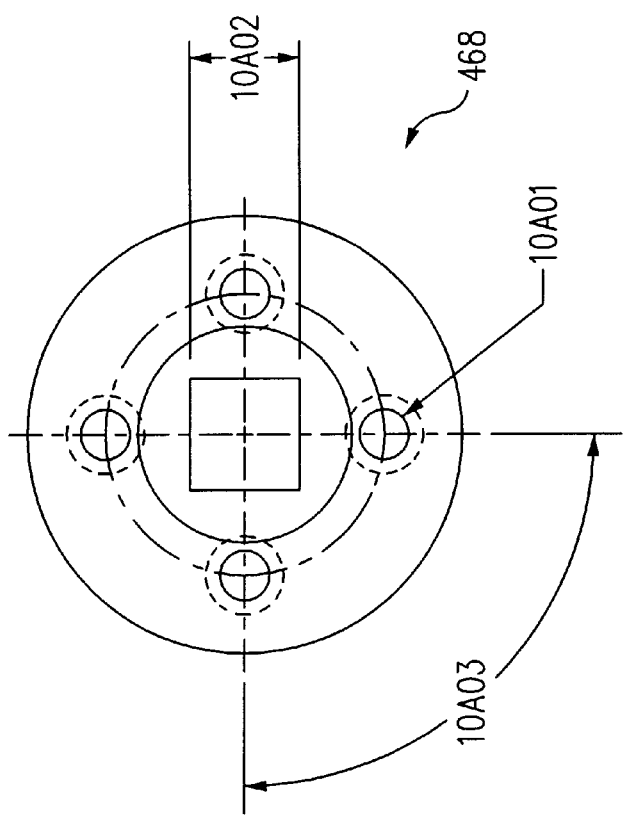
FIG. 10A is a top view of one embodiment of a draw bar guide of this invention.
Figure 10B:
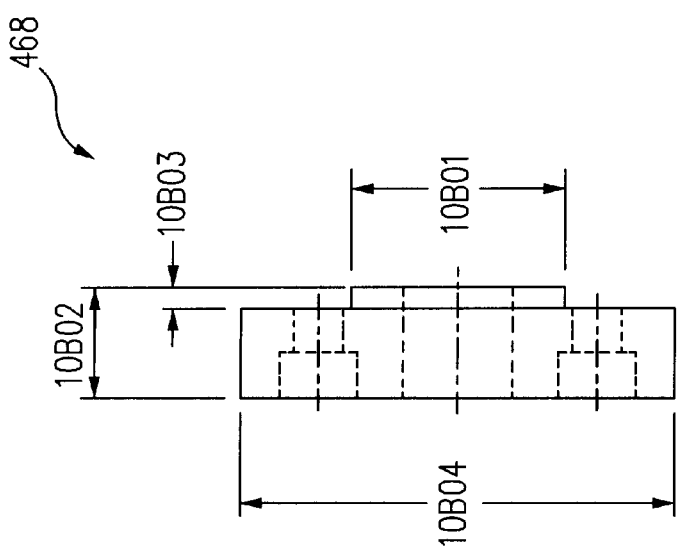
FIG. 10B is a side view of the draw bar guide of FIG. 10A.

FIG. 10A is a top view of one embodiment of draw bar guide 468 (FIG. 4). FIG. 10B is a side view of draw bar guide 468. In this embodiment, collet draw bar guide 468 is 316L stainless steel, and has an electropolish finish.

TABLE 6 presents one embodiment of dimensions for collet draw bar guide 468 that are used with a collet spindle

405 having the dimensions given in TABLE 3.

TABLE 6
REPRESENTATIVE DIMENSIONS FOR COLLET DRAW BAR GUIDE 468

| Reference Number | Dimension | Units |
|---|---|---|
| 10A01 | 0.136 diameter thru/0.219 diameter by 0125 deep on far side on a 0.804 diameter B.C. | Inches |
| 10A02 | 0.313 thru square | Inches |
| 10A03 | 90 | Degrees |
| 10B01 | 0.624 diameter | Inches |
| 10B02 | 0.312 | Inches |
| 10B03 | 0.062 | Inches |
| 10B04 | 1.250 diameter | Inches |

Figure 11A:
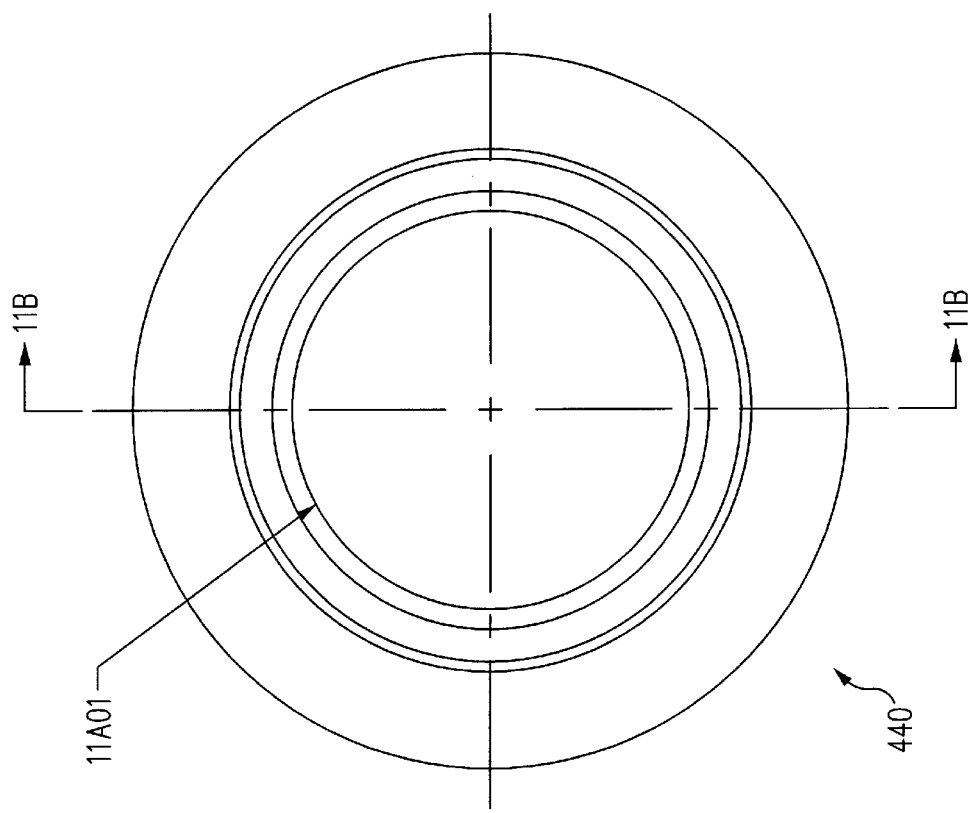
FIG. 11A is a top view of one embodiment of a sleeve cap of this invention.
Figure 11B:
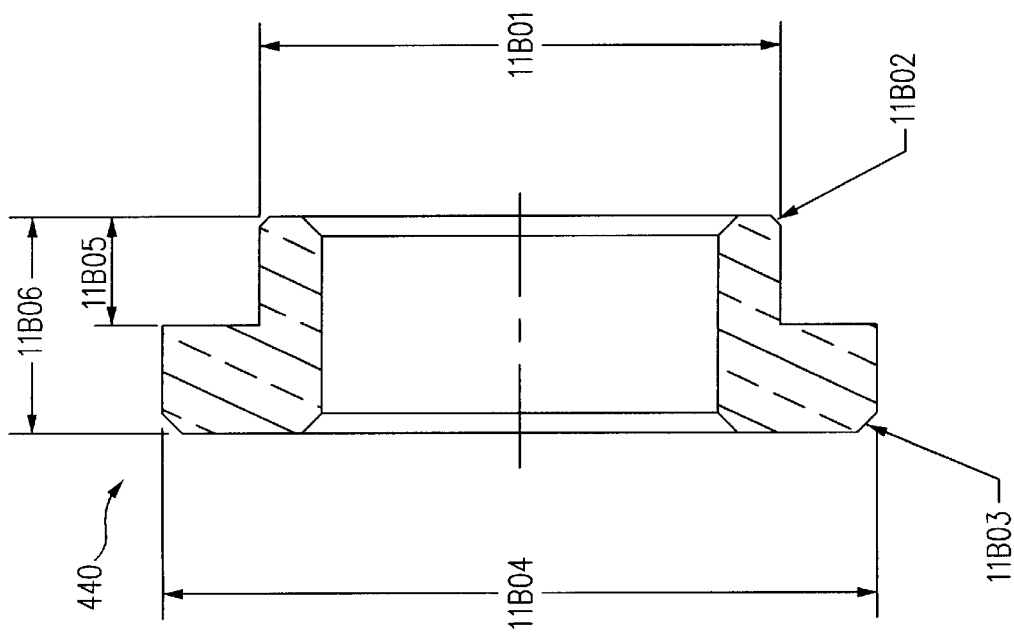
FIG. 11B is cutaway cross section as indicated in FIG. 11A of the sleeve cap of FIG. 11A.

FIG. 11A is a top view of sleeve cap 440. FIG. 11B is cutaway cross section as indicated in FIG. 11A. In this embodiment, sleeve cap 440 is opaque quartz with a fire polish finish.

TABLE 7 presents one embodiment of dimensions for sleeve cap 440 that are used with a collet spindle 405 having the dimensions given in TABLE 3.

TABLE 7
REPRESENTATIVE DIMENSIONS FOR SLEEVE CAP 440

| Reference Number | Dimension | Units |
|---|---|---|
| 11A01 | 1.188 diameter | Inches |
| 11B01 | 1.560 diameter | Inches |
| 11B02 | 0.03 × 45° chamfer | Inches |
| 11B03 | 0.06 × 45° chamfer | Inches |
| 11B04 | 2.123 | Inches |
| 11B05 | 0.313 | Inches |
| 11B06 | 0.625 | Inches |

Figure 12A:
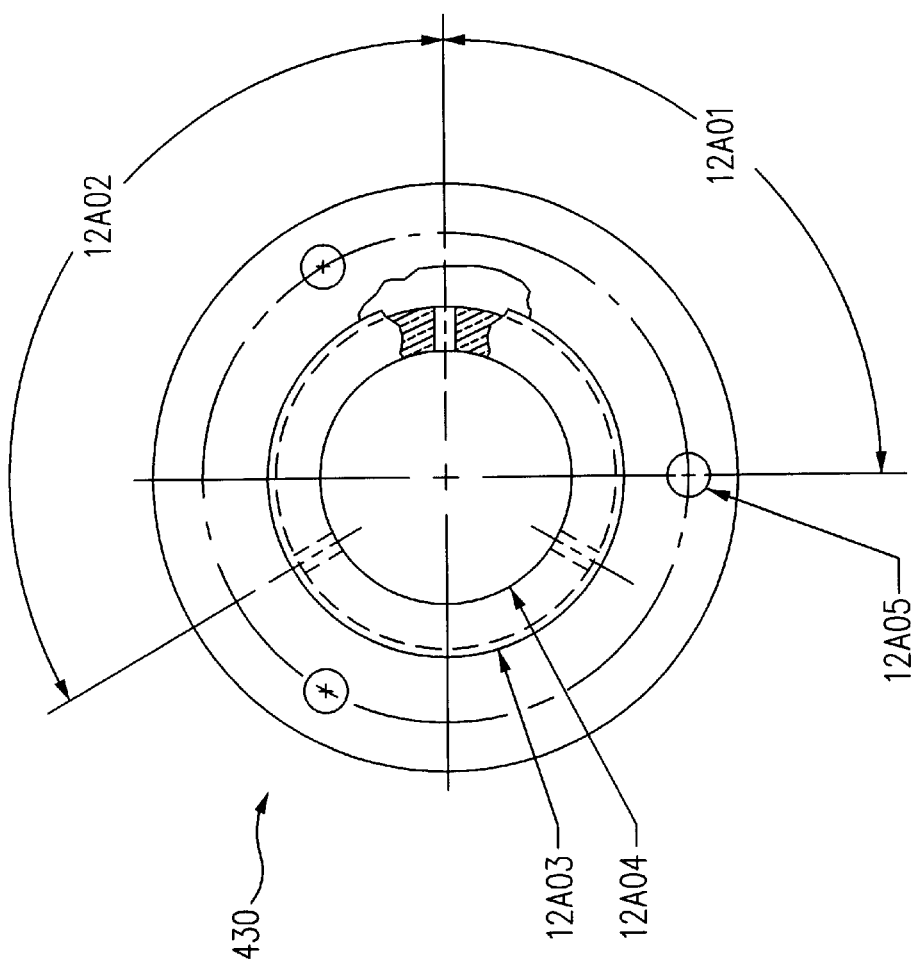
FIG. 12A is a top view of one embodiment of a sleeve of this invention.
Figure 12B:
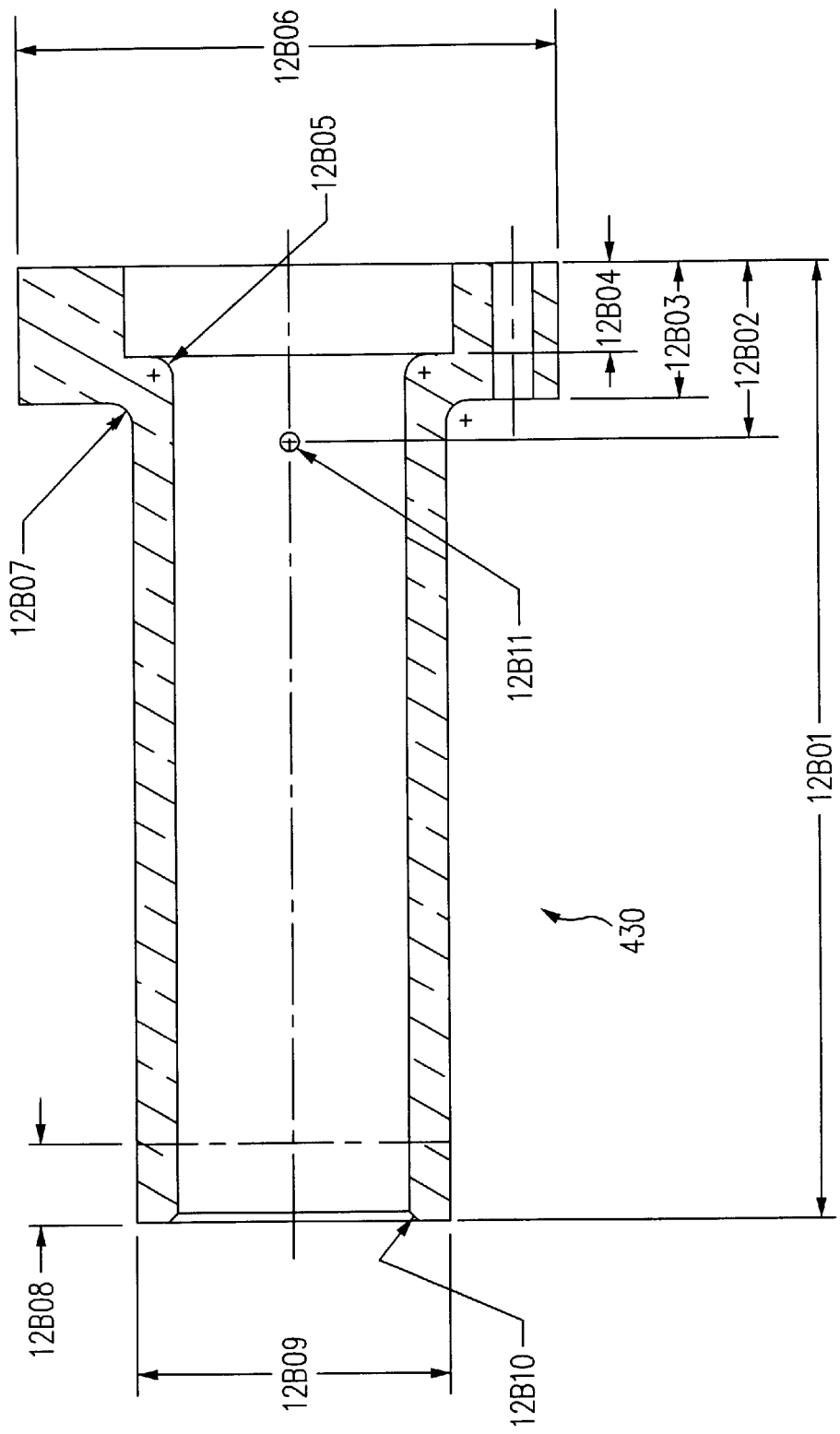
FIG. 12B is cutaway cross section view of the sleeve of FIG. 12A.

FIG. 12A is a top view of sleeve 430. FIG. 12B is a cross section view of sleeve 430. In this embodiment, sleeve 430 is opaque quartz with a fire polish finish.

TABLE 8 presents one embodiment of dimensions for sleeve 430 that are used with a collet spindle 405 having the dimensions given in TABLE 3.

TABLE 8
REPRESENTATIVE DIMENSIONS FOR SLEEVE 430

| Reference Number | Dimension | Units |
|---|---|---|
| 12A01 | 90 | Degrees |
| 12A02 | 120 | Degrees |
| 12A03 | 2.250 diameter | Inches |
| 12A04 | 1.563 diameter thru | Inches |
| 12A05 | 0.281 diameter thru on a 3.00 diameter B.C. evenly spaced | Inches |
| 12B01 | 6.314 | Inches |
| 12B02 | 1.130 | Inches |
| 12B03 | 0.88 | Inches |
| 12B04 | 0.58 | Inches |
| 12B05 | 0.13 radius | Inches |
| 12B06 | 3.63 diameter | Inches |
| 12B07 | 0.13 radius | Inches |
| 12B08 | 0.50 | Inches |
| 12B09 | 2.123 | Inches |
| 12B10 | 0.06 × 45° chamber | Inches |
| 12B11 | 0.13 diameter thru | Inches |

Upper spindle bearing 461 and lower spindle bearing 462 are mounted about collet spindle 405 at a top of spindle housing 460, and near a bottom of spindle housing 460, respectively. A lip of collet spindle 405 rests on a top surface of an inner race of upper spindle bearing 461 while a bearing retainer is mounted in a groove of spindle housing 460. The bearing retainer contacts a top surface of an outer race of upper spindle bearing 461. A bottom surface of the inner race contacts a inner race spacer 465 that also contacts a top surface of an inner race of lower spindle bearing 462 that is positioned about a bottom portion of the circumferential outer surface of collet spindle 405. A bottom surface of the outer race of upper spindle bearing 461 rests on a rim of spindle housing 460.

Spindle bearing preload spring 469 is positioned in a bore of spindle housing 460 so that spring 469 applies pressure on outer bearing race retainer 463. Outer bearing race retainer 463 rests on a top surface of the outer race of lower spindle bearing 462. A bottom surface of the inner race of lower spindle bearing 462 contacts a guide draw bar 468 that is affixed to coupler shaft 466. Spindle bearings 461 and 462 allow collet spindle 405 to rotate within spindle housing 460, which in turn rotates collet 415 and susceptor shaft 410.

One rotary-linear seal unit 485 suitable for use in this invention is available from Ferrofluidics Corporation, 40 Simon Street, Nashua, N.H. 03061-2009 under Part No. 52-121577. As explained above, rotary-linear seal unit 485 provides a seal to prevent process gasses from escaping to the atmosphere, and transfers both linear and rotary motion therethrough. Seal unit 485 has a stainless steel bellows 481A that provides a seal between the linear motion shaft and the bearing/rotary shaft.

Figure 13:
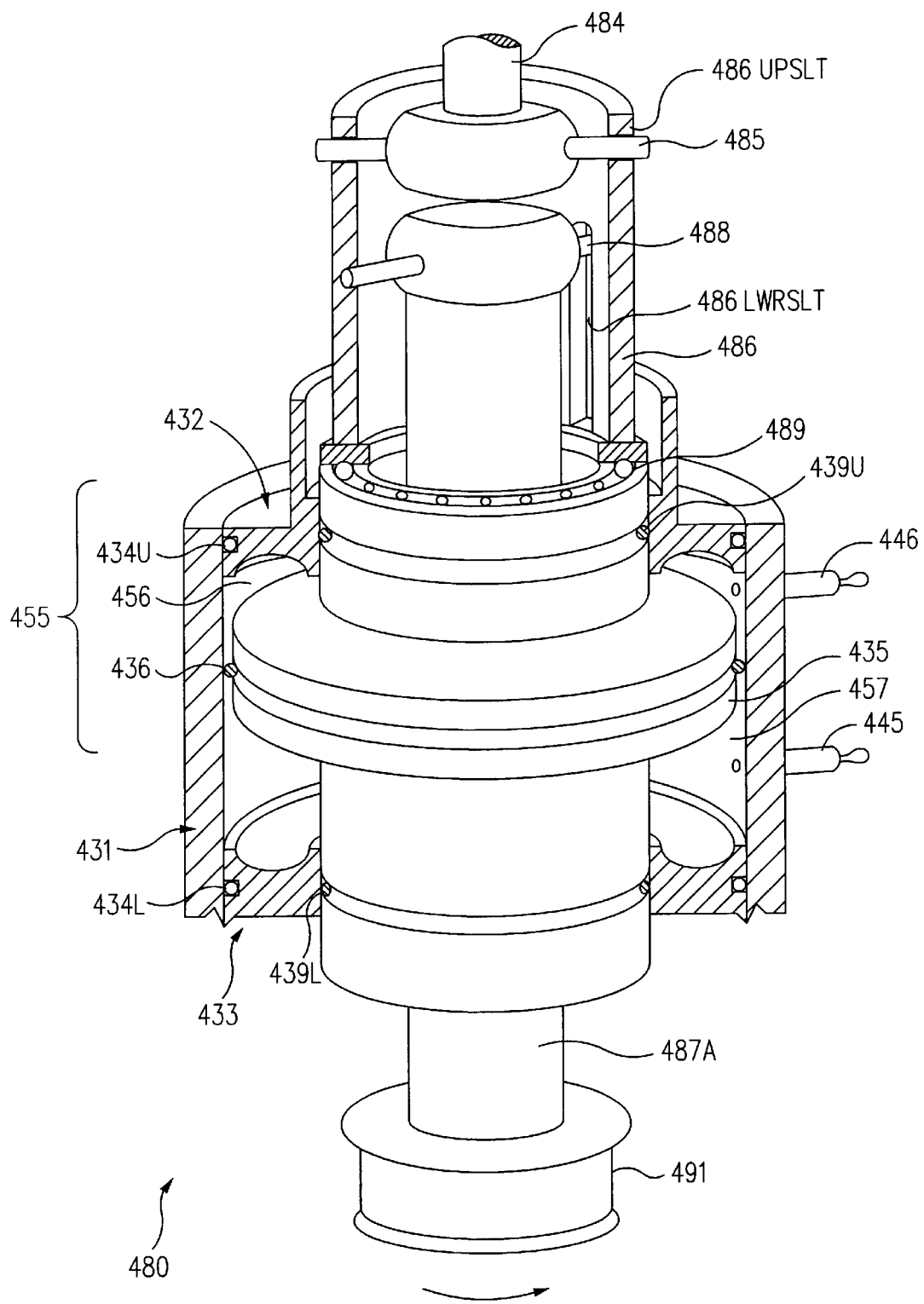
FIG. 13 is a partial cross section of the motion coupler unit and the linear drive unit of FIG. 4.
Figure 14:
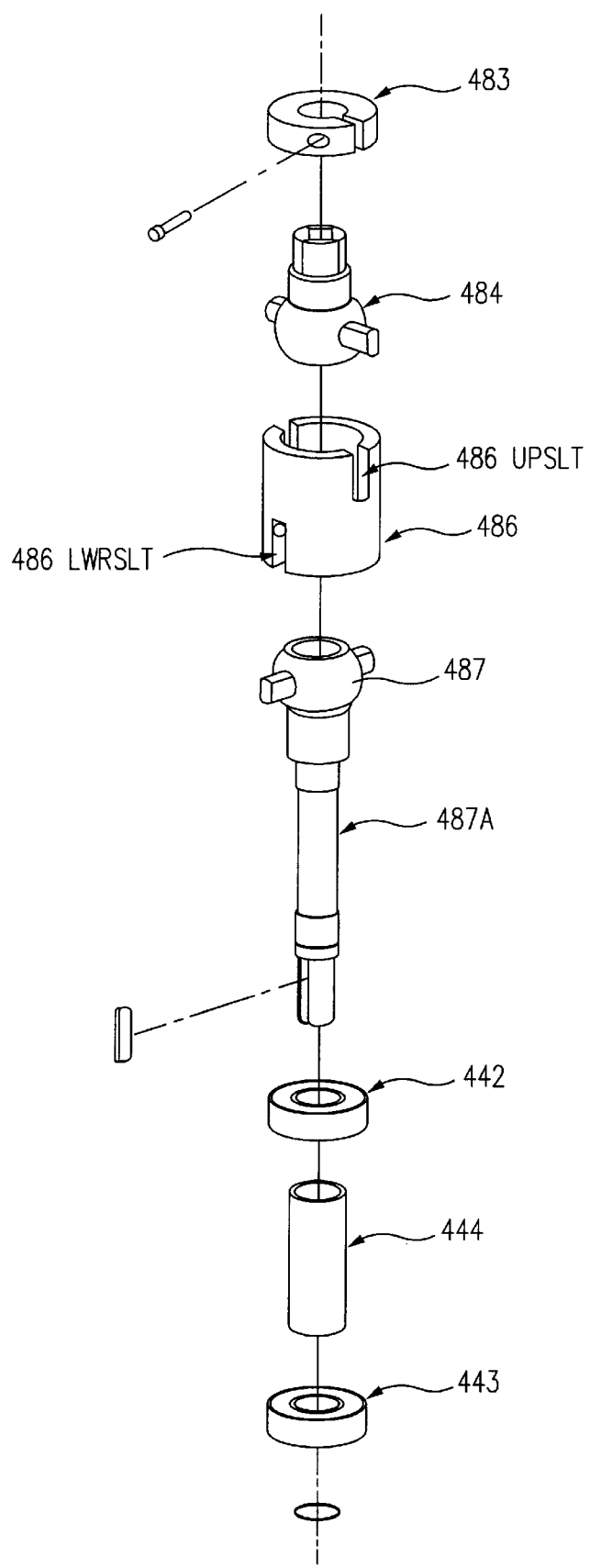
FIG. 14 is an exploded assembly drawing of the motion coupler unit of this invention.

Seal unit 485 is connected to motion coupler unit 482 by a split coupling 483 that connects a shaft of seal unit 485 to upper coupling ball 484. A pair of upper coupling pins 485 is mounted in upper coupling ball 484. Upper coupling ball 484 is mounted within a coupling sleeve 486 so that pins 485 are placed in upper elongated slots 486UPSLT (FIGS. 13 and 14. ) that extend down from a top of coupling sleeve 486, i.e., a first set of slots in a cylindrical wall that extend from a first edge surface of the coupling sleeve.

A coupling shaft ball 487 is rigidly connected to a shaft, which in turn is rigidly connected to a pulley 491. A pair of lower coupling pins 488 is mounted in coupling shaft ball 487. Coupling shaft ball 484 is mounted within coupling sleeve 486 so that pins 488 are placed in lower elongated slots 486LWRSLT that extend upward from a bottom of coupling sleeve 486, i.e., a second set of slots in the cylindrical wall that extend from a second edge surface of the coupling sleeve. Each slot is ninety degrees from the two slots in the other set.

Rotational motion is transferred from lower coupling shaft ball 487 through coupling sleeve 486 to upper coupling ball 484. Coupling sleeve 486 rests on a thrust bearing 489. Upper coupling ball 484 transfers the rotational motion to the shaft of rotary-linear seal unit 481.

Linear motion drive unit 480 (FIG. 4.) includes a cylindrical unit 455 that has a cylindrical base 431, an upper cylindrical cap 432, and a lower cylindrical cap 433. (See also FIG. 13.) Cylindrical base 431 includes an integral connecting arm extending from one side (See FIG. 15.) that in turn supports a stepper motor assembly 495 used in rotary drive unit 490. A flange support 437 is attached to a plurality of shaft support rods 438 that in turn are connected pedestal lift plate 470. Flange support 437 is connected to a top surface of cylindrical base 431. In this embodiment, the connections are made using threaded bolts.

An O-ring 434U is mounted in a channel formed in the outer circumferential edge surface of upper cylindrical cap 432. Similarly, an O-ring 434L is mounted in a channel formed in the outer circumferential edge surface of lower cylindrical cap 433. O-rings 434U and 434L form a seal between an inner circumferential wall of cylindrical base 431 and the outer circumferential edge surfaces of the two cylindrical caps.

An actuator piston 435 is positioned within cylindrical base 431. Shaft 487A is fitted within a first bore along the central axis of actuator piston 435. An upper bearing 442 is mounted about shaft 487A. Upper bearing 442 is mounted within a second bore along the central axis of actuator piston 435. A lower bearing 443 is mounted about shaft 487A and is separated from upper bearing 442 by a bearing spacer 444. Lower bearing 443 is mounted with a central bore of lower cylindrical cap 433 and is held in place with upper and lower retaining rings. Thus, shaft 487A is rotatable within actuator piston 435. Thrust bearing 489 sits on a top edge surface of actuator piston 435 and provides vertical support to coupling sleeve 486. A second bore in upper cylindrical cap 432 prevents lateral motion of thrust bearing 489.

An O-ring 436 is mounted in a channel in a major outer circumferential edge surface of actuator piston 435. O-ring 436 forms a seal between the outer circumferential edge surface of actuator piston 435 and the inner circumferential wall of cylindrical base 431. An O-ring 439U is mounted in a channel in a minor upper outer circumferential edge surface of actuator piston 435. O-ring 439U forms a seal between the minor upper outer circumferential edge surface of actuator piston 435 and an inner circumferential wall of upper cylindrical cap 432. An O-ring 439L is mounted in a channel in a minor lower outer circumferential edge surface of actuator piston 435. O-ring 439L forms a seal between the minor lower outer circumferential edge surface of actuator piston 435 and an inner circumferential wall of lower cylindrical cap 433. Here, major and minor denote the relative sizes of the radii defining the circumferential edge surfaces.

Actuator piston 435 divides an interior volume bounded by a bottom surface of upper cylindrical cap 432, a top surface of lower cylindrical cap 433 and the inner circumferential wall of cylindrical base 431 into an upper interior volume 456 and a lower interior volume 457. To move shaft 487A and consequently collet 415 upwards, compressed air is allowed to enter the lower interior volume 457 through air port 445. The compressed air moves actuator piston 435 upwards.

This upward motion is transmitted through thrust bearing 488 to coupling sleeve 486. The bottom of upper elongated slots 486UPSLT engages pins 485, which in turn causes, draw bar 420 to move upwards. Lower elongated slots 486LWRSLT allow relative motion between coupling pins 488 and coupling sleeve 486. Thus, when coupling pins 485 and coupling shaft 466 are pushed upwards, coupling pins 488 and shaft 487A are left in the original vertical position. This allows vertical motion of collet 415 without requiring any vertical displacement of rotary drive unit 490.

To allow shaft 466 and consequently collet 415 to move downwards, compressed air is bled from lower interior volume 457. Clamp spring 404 (FIG. 2A.) pushes against draw bar lock sleeve 464, which in turn pushes draw bar 420 down, and this motion causes actuator piston 435 to move downwards and thus allowing thrust bearing 489 and coupling sleeve 486 to move downwards. In one example, to assist the downward movement of actuator piston 435, compressed air enters upper interior volume 456 through air port 446. In some embodiments, compressed water or compressed oil is used instead of compressed air to move actuator piston 435 up or down. Thus, according to the principles of this invention, the linear motion drive unit can be either a pneumatic linear motion drive unit or a hydraulic linear motion drive unit. As used herein, linear motion means motion along a longitudinal axis of the collet assembly, e.g., motion up and down axis 498.

Hence, rotary-linear drive unit 450 provides a motive force that results in collet 415 being engaged and released. Drive unit 450, either simultaneously or independently, provides a rotary force that results in collet 415 being rotated. A novel motion coupler unit 482 allows this combined range of motions.

Figure 15:
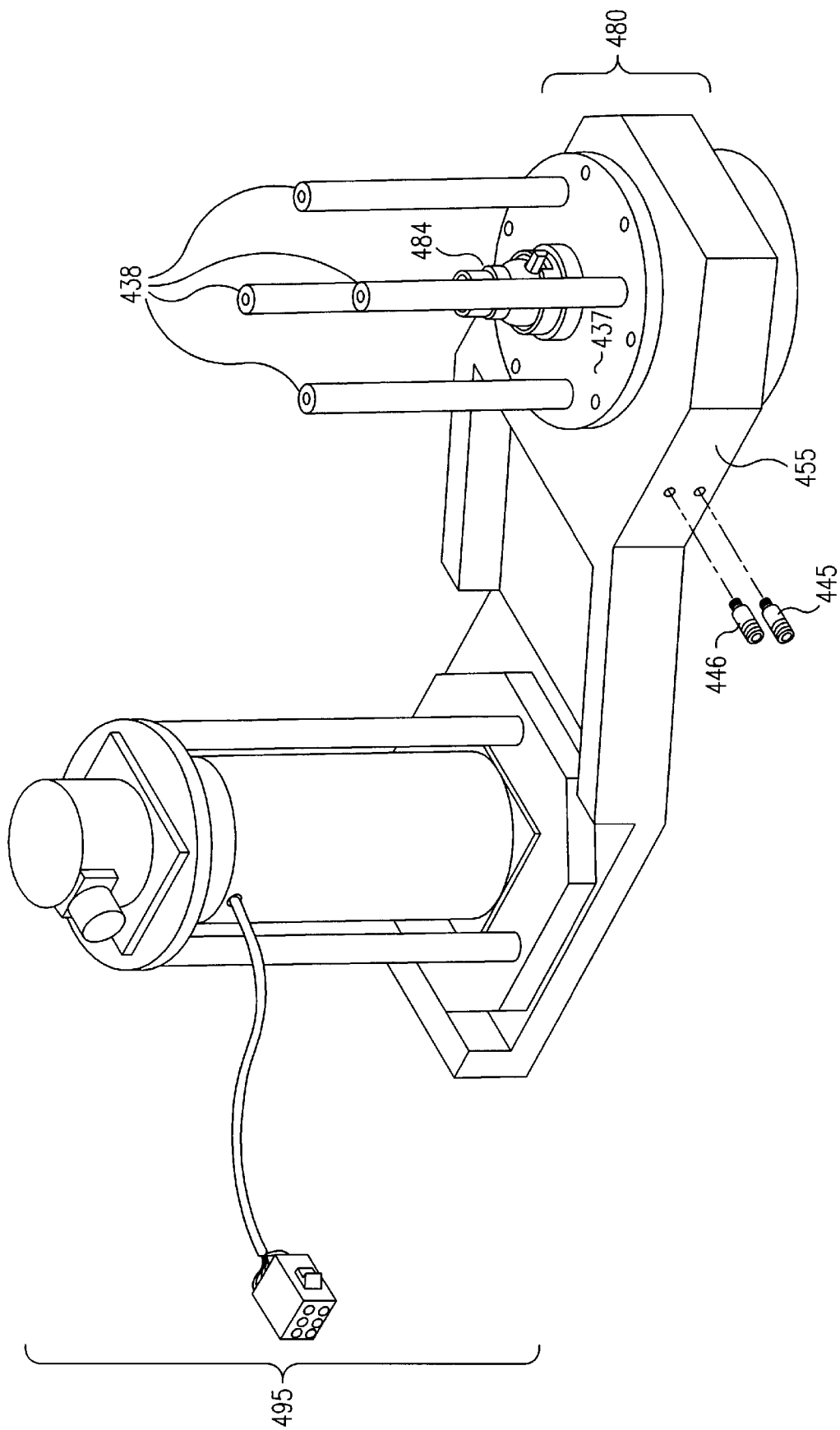
FIG. 15 is a perspective view of a portion of the rotary-linear drive unit of this invention that includes a linear motion drive unit and a rotary motion drive unit.

FIG. 15 is a perspective view of a portion of rotary-linear drive unit 450 that includes linear motion drive unit 480 and rotary motion drive unit 495. Rotary drive unit 495 is similar to those used in the prior art and so is not considered further. A stepper motor in rotary drive unit 495 turns a pulley that in turn moves rotary drive belt 493 that turns pulley 491. As described above, the rotary motion of pulley 491 is transferred to collet 415 and consequently the susceptor. Those of skill in the art will appreciate that the susceptor is one example of an energy stabilizer that is commonly used to support substrates in a reactor.

The drawings and the forgoing description gave examples of the present invention. The scope of the present invention, however, is by no means limited by these specific examples. Numerous variations, whether explicitly given in the specification, such as differences in structure, dimension, and use of material, are possible. The scope of the invention is at least as broad as given by the following claims.

I claim:

1. A substrate processing reactor comprising:
    a collet assembly including a collet wherein in a first position said collet holds a susceptor shaft and in a second position said collet releases said susceptor shaft; and
    a rotary-linear drive unit coupled to said collet assembly wherein said rotary-linear drive unit provides a motive force to said collet assembly to move said collet assembly between said first and second position, and said rotary-linear drive unit provides rotary motion to said collet assembly.

2. The reactor of claim 1 wherein said collet assembly further comprises:
    a draw bar connected to said collet.

3. The reactor of claim 2 wherein said collet assembly further comprises:
    at least one clamp spring mounted about said draw bar.

4. The reactor of claim 3 wherein said collet assembly further comprises:
    a collet spindle having a first bore and a second bore wherein said collet is mounted in said first bore and said draw bar is mounted in said second bore.

5. The reactor of claim 1 wherein said rotary-linear drive unit further comprises:

a motion coupler unit coupled to said collet assembly.

6. The reactor of claim 5 wherein said rotary-linear drive unit further comprises:

a linear motion drive unit coupled to said motion coupler unit wherein said linear motion drive unit generates said motive force that is provided to move said collet assembly between said first and second positions.

7. The reactor of claim 5 wherein said rotary-linear drive unit further comprises:

a rotary motion drive unit coupled to said motion coupler unit wherein said rotary motion drive unit generates said rotary motion that is provided to said collet assembly.

8. The reactor of claim 1 wherein said collet includes a plurality of pieces.

9. The reactor of claim 8 wherein said collet assembly further comprises:

a collet spindle having a first bore and a second bore wherein said plurality of pieces is mounted in said first bore.

10. A substrate processing reactor comprising:

a collet assembly including a collet wherein in a first position said collet holds a susceptor shaft and in a second position said collet releases said susceptor shaft; and a rotary-linear drive unit coupled to said collet assembly wherein said rotary-linear drive unit provides a motive force to said collet assembly to move said collet assembly between said first and second position, and said rotary-linear drive unit provides rotary motion to said collet assembly and further wherein said rotary-linear drive unit comprises:

a motion coupler unit coupled to said collet assembly wherein said motion coupler unit further comprises:

a sleeve having a top surface and a bottom surface bounding a wall of said sleeve with a first set of slots in said wall extending from said top surface, and a second set slots extending from said bottom surface;

a first shaft movably mounted in said first set of slots; and a second shaft movably mounted in said second set of slots.

11. The reactor of claim 10 wherein said rotary-linear drive unit further comprises a linear motion drive unit coupled to said sleeve wherein said linear motion drive unit generates said motive force that is provided to said sleeve to move said collet assembly between said first and second positions.

12. The reactor of claim 11 wherein said linear motion drive unit is a hydraulic drive unit.

13. The reactor of claim 11 where said hydraulic drive unit is a pneumatic drive unit.

14. The reactor of claim 10 wherein said rotary-linear drive unit further comprises:

a rotary motion drive unit coupled to said second shaft wherein said rotary motion drive unit generates said rotary motion that is provided to said second shaft and in turn to said collet assembly.

15. The reactor of claim 10 wherein said collet assembly further comprises:

a draw bar connected to said collet.

16. The reactor of claim 15 wherein said collet assembly further comprises:

at least one clamp spring mounted about said draw bar.

17. The reactor of claim 16 wherein said collet assembly further comprises:

a collet spindle having a first bore and a second bore wherein said collet is mounted in said first bore and said draw bar is mounted in said second bore.

18. The reactor of claim 10 wherein said collet includes a plurality of pieces.

19. The reactor of claim 18 wherein said collet assembly further comprises:

a collet spindle having a first bore and a second bore wherein said plurality of pieces is mounted in said first bore.

20. A method for grasping and releasing a susceptor shaft in a substrate processing reactor comprising:

placing a susceptor shaft in a collet;

moving said collet in a first direction using a linear drive unit to release said susceptor shaft;

moving said collet in a second direction opposite to said first direction to grasp said susceptor shaft wherein said first and second directions are about a longitudinal axis of said collet; and rotating said collet using a rotary drive unit independent of a location of said collet along said longitudinal axis of said collet.

* * * * *